(12) United States Patent
Misawa

(10) Patent No.: US 7,172,923 B2
(45) Date of Patent: Feb. 6, 2007

(54) IMAGING DEVICE AND MANUFACTURING METHOD FOR IMAGING DEVICE

(75) Inventor: Atsushi Misawa, Saitama (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 26 days.

(21) Appl. No.: 10/414,158

(22) Filed: Apr. 16, 2003

(65) Prior Publication Data

US 2003/0203532 A1   Oct. 30, 2003

(30) Foreign Application Priority Data

Apr. 26, 2002  (JP)  ............................. 2002-125835
Apr. 26, 2002  (JP)  ............................. 2002-125836
Mar. 25, 2003  (JP)  ............................. 2003-082089

(51) Int. Cl.
  *H01L 21/00*   (2006.01)
(52) U.S. Cl. ...................................................... 438/89
(58) Field of Classification Search .................. 438/89, 438/106; 257/159, 679; 348/373, 340, 335, 348/297, 76, 374; 136/253; 361/777, 751
See application file for complete search history.

(56) References Cited

U.S. PATENT DOCUMENTS 5,400,072 A * 3/1995 Izumi et al. ................ 348/335
5,454,879 A * 10/1995 Bolger ........................ 136/253
6,156,587 A * 12/2000 Kayanuma et al. ......... 438/106
2001/0050721 A1 * 12/2001 Miyake ....................... 348/374

FOREIGN PATENT DOCUMENTS

| JP | 61-138909 A | 6/1986 |
| JP | 61-245773 A | 11/1986 |
| JP | 07-202152 A | 8/1995 |
| JP | 09-018649 A | 1/1997 |
| JP | 11-191865 A | 7/1999 |

* cited by examiner

*Primary Examiner*—Carl Whitehead, Jr.
*Assistant Examiner*—Monica D. Harrison
(74) *Attorney, Agent, or Firm*—Sughrue Mion, PLLC

(57) ABSTRACT

An imaging device unit comprises a CCD chip and a substrate on which the CCD chip is soldered. A light receiving surface is provided in the front surface of the CCD chip. A dustproof member for protect the light receiving surface from dust is attached around the light receiving surface. Chip terminals are arranged between the light receiving surface and the dustproof member. When the CCD chip is pressed against the rear surface of the substrate, the dustproof member is elastically deformed and tightly makes contact with the substrate. Since ultrasound is applied to the chip terminals and the substrate terminals in this state to melt them, the CCD chip is positioned in parallel with the substrate. Upon stopping ultrasound horns, both of the terminals are immediately soldered to each other, so that the CCD chip is securely fixed on the substrate with ease.

26 Claims, 20 Drawing Sheets

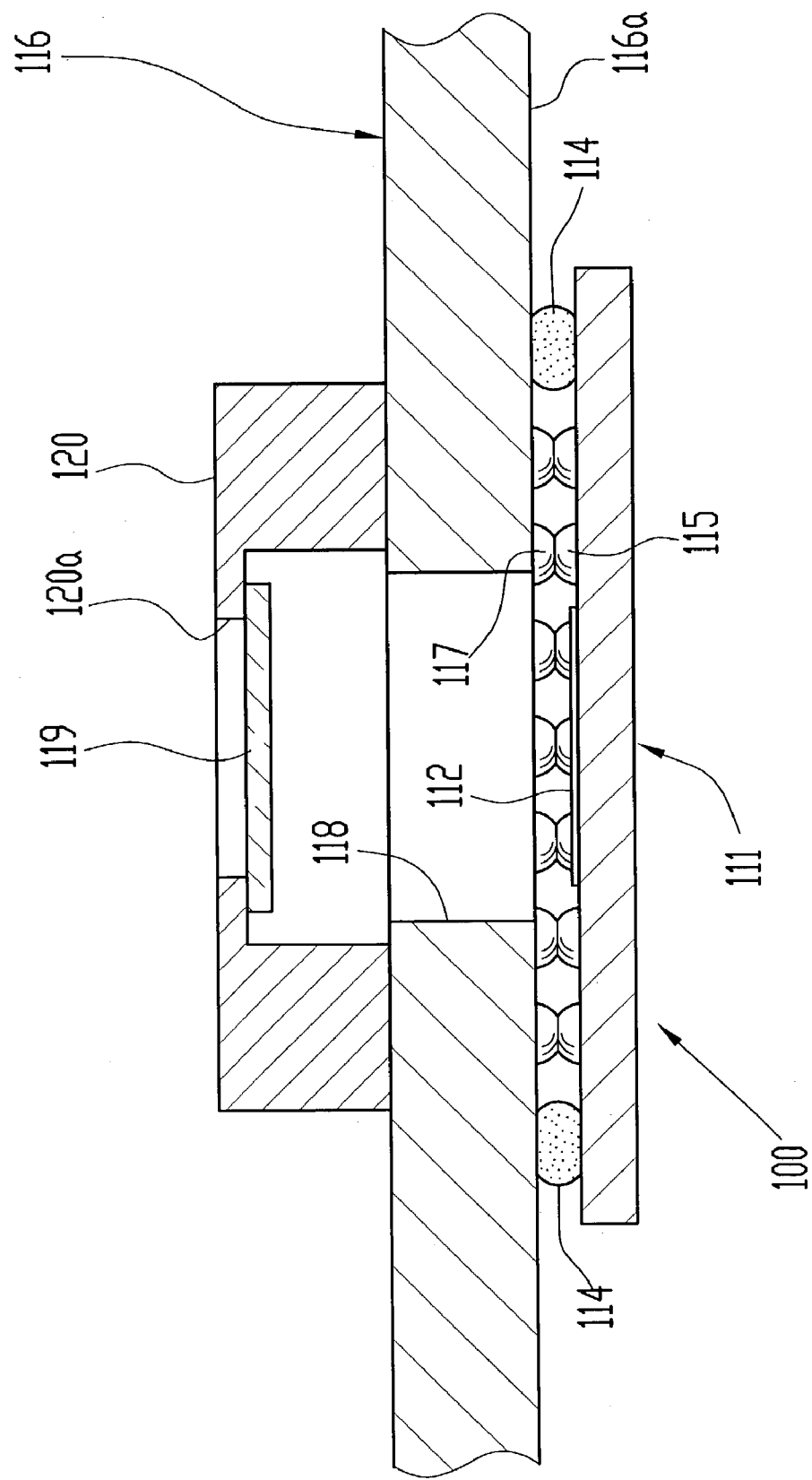

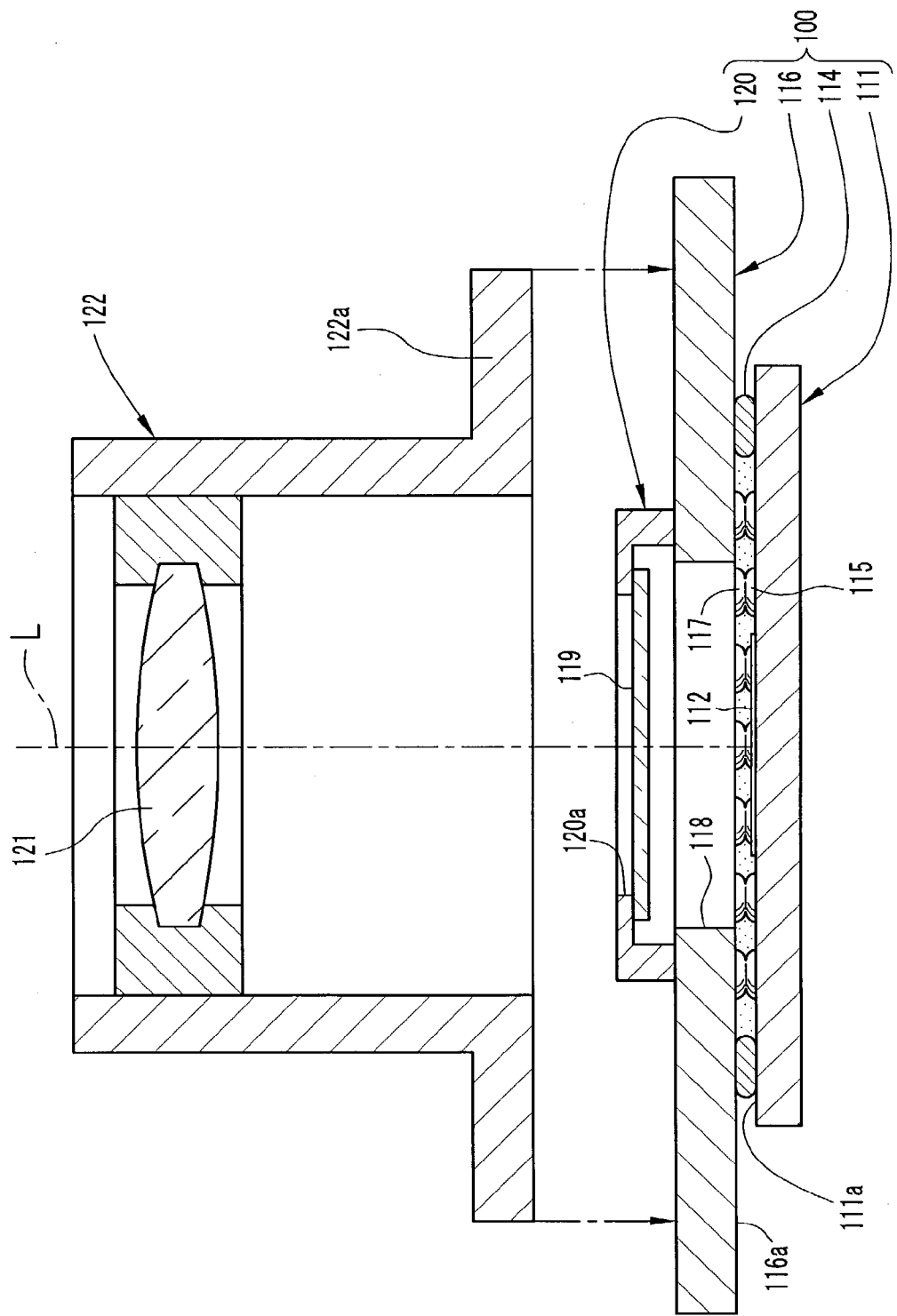

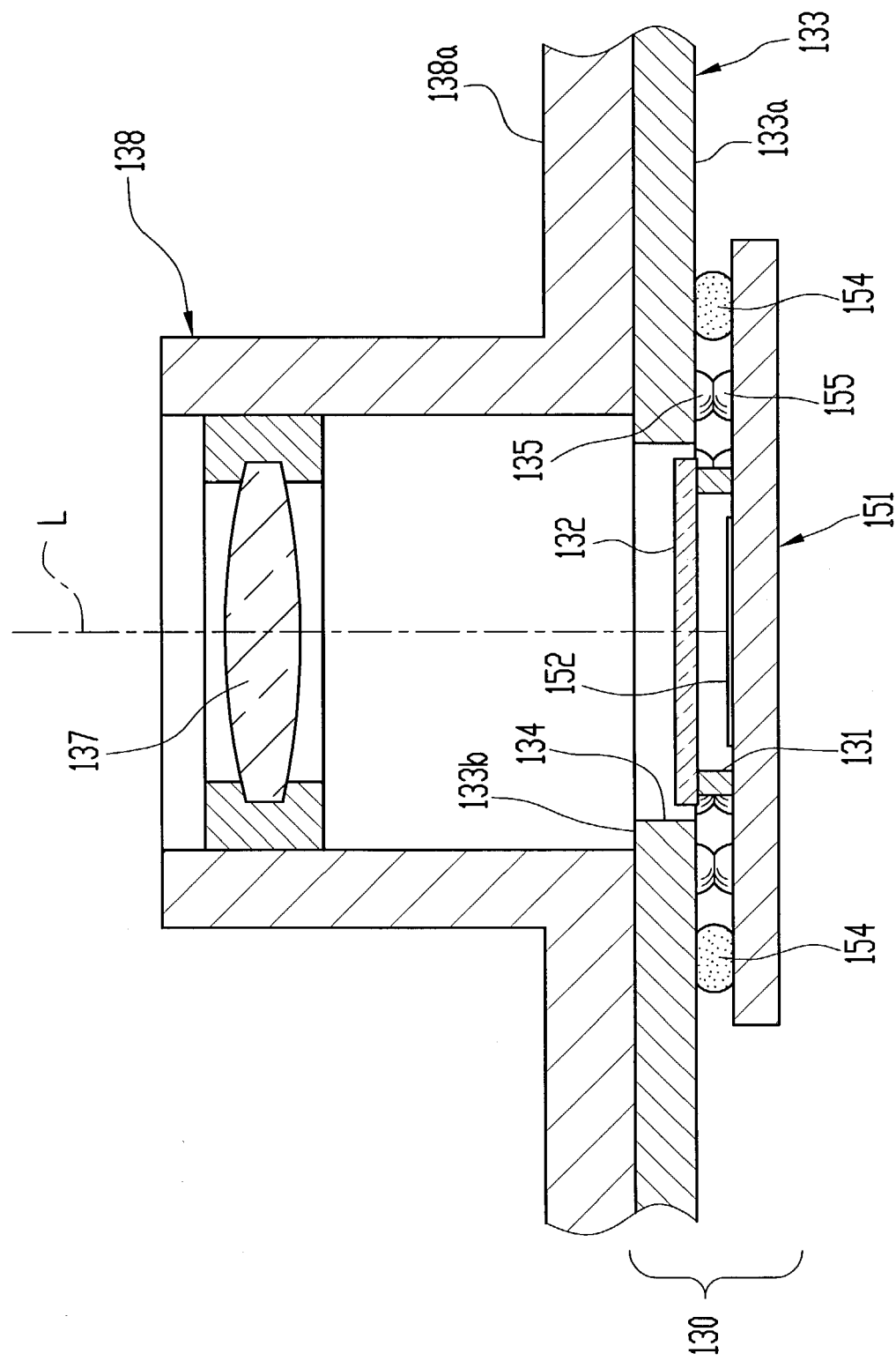

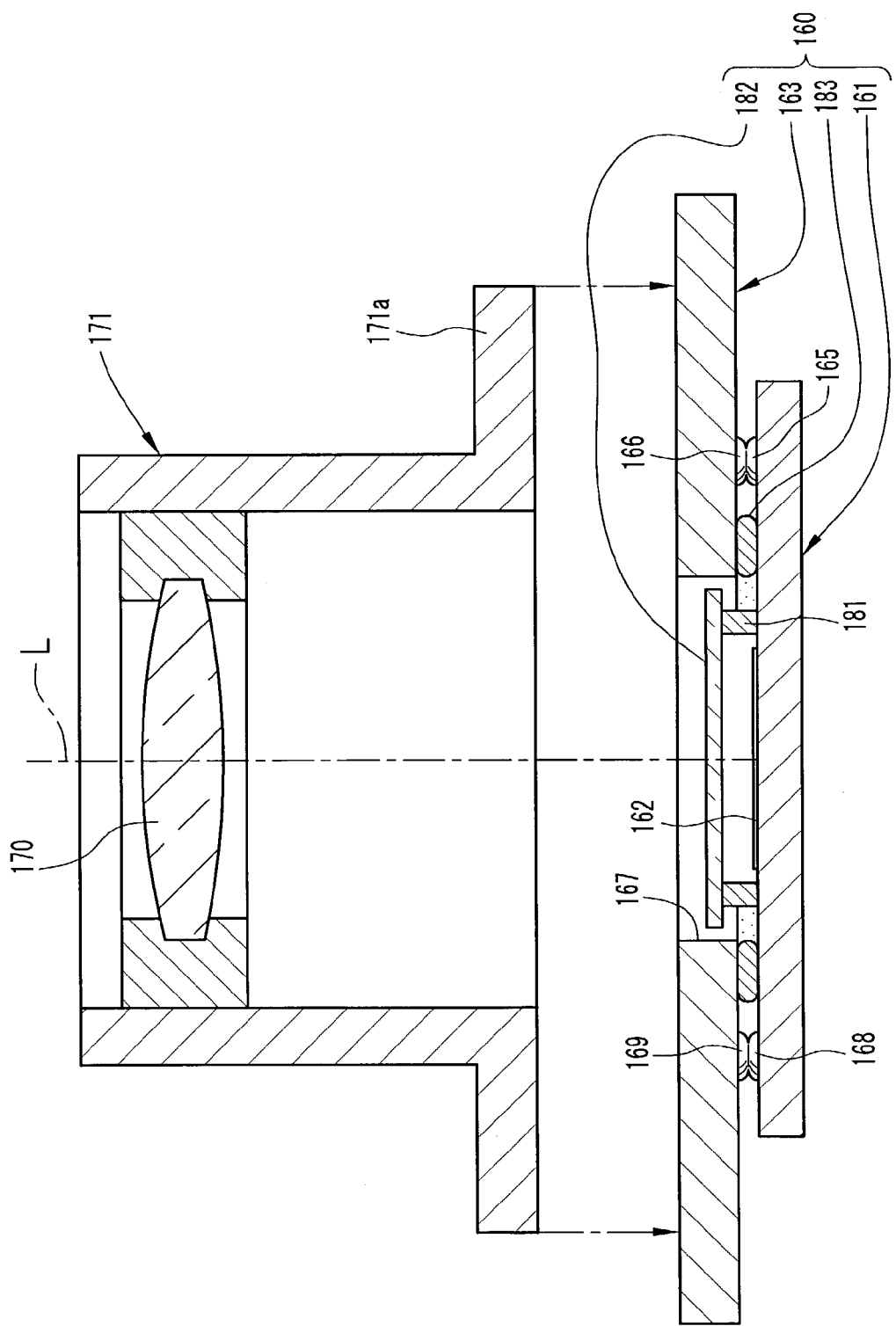

IMAGING DEVICE AND MANUFACTURING METHOD FOR IMAGING DEVICE

BACKGROUND OF THE INVENTION

1. Field of the Invention

The present invention relates to an imaging device which contributes to the reduced thickness of a camera.

2. Background Arts

A digital camera and a video camera, which rapidly become pervasive in recent years, are provided with an imaging device chip such as a CCD image sensor, a CMOS image sensor, and the like. The imaging device chip photoelectrically transfers an image which is optically formed on a light receiving surface into image signals. The outputted image signals are sent to an image signal processing circuit, for example, and the image is displayed on an LCD. To obtain the sharp image over the whole picture frame, it is necessary to install the imaging device chip in such a manner that the light receiving surface is perpendicular to an optical axis. Accordingly, various types of imaging devices are suggested.

Japanese Patent Laid-Open Publication No. 61-138909, for example, discloses a solid-state image sensor unit having an inclination adjustment device. The inclination adjustment device has a fixed base board fixed on a flange of a lens barrel, and a movable base board secured to the fixed base board with screws. The movable base board, secured to the fixed base board with the two screws via coil springs, is always in contact with a shaft member provided at the center of the fixed base board by the bias of the springs. An imaging device chip is fixed on the movable base board, and a substrate is disposed in the rearward of the movable base board. The inclination adjustment device adjusts the inclination of the imaging device chip against an optical axis by means of tightening and loosing the two screws.

In order to prevent dust from adhering to an exposed light receiving surface, it is generally known that an imaging device package, comprising an imaging device chip and a package for tightly containing the imaging device chip, is installed in a digital camera and the like.

Japanese Patent Laid-Open Publication No. 61-245773, for example, discloses a video camera having an imaging device chip which is contained in a ceramic package. The imaging device chip maintains a predetermined physical relation with the ceramic package, and the ceramic package keeps a light receiving surface of the imaging device chip in parallel with the front surface of a fixed base board. The ceramic package, the position of which is fixed by two positioning pins, is secured to a flange of a lens barrel with screws.

In the imaging device package described above, however, it is difficult to miniaturize a camera. Accordingly, Japanese Patent Laid-Open Publication No. 7-202152 discloses a solid-state imaging device in which an airtight sealing section including a transparent member covers an only light receiving surface having micro lenses in order to miniaturize a camera.

Japanese Patent Laid-Open Publication No. 9-18649 discloses a document reader in which a bare imaging device chip is installed. The bare imaging device chip is fixed on a substrate. The substrate forms enclosed space together with an optical lens and a camera body (a lens barrel). Since the bare imaging device chip is disposed inside the enclosed space, dust does not adhere to the light receiving surface.

In any of these cases described above, however, the substrate or the base board for positioning is disposed in the rearward of the imaging device, so that it is impossible to shorten the length of the camera in an optical axis direction. In other words, there is a disadvantage in miniaturizing the camera because the thickness of the camera cannot be slimmed.

It is necessary for preventing reduction in magnifying power and optical performance of a taking lens to maintain a predetermined optical length. To slim the camera with maintaining the optical length, it is effective to reduce a dimension backward of the light receiving surface of the imaging device chip (a direction opposite to the taking lens). Accordingly, it is considerable to fix the imaging device chip on the substrate in such a manner that the light receiving surface is exposed through an opening formed in the substrate. In this case, the thickness of the substrate is included in the optical length, so that it is possible to slim the camera without reducing the magnifying power and optical performance of the taking lens.

Japanese Patent Laid-Open Publication No. 11-191865 discloses a solid-state imaging device including an imaging device unit which comprises an imaging device chip (a CCD chip), a film carrier, a transparent member, and a lens integral with a lens barrel. The imaging device unit is fixed to a substrate in such a manner as to be inserted into an opening formed in the substrate. Sealant composed of epoxy resin is charged between the film carrier and the periphery of the imaging device chip, for the purpose of protecting the imaging device chip from moisture and the like.

According to the imaging device of the Japanese Patent Laid-Open Publication No. 11-191865, complex soldering process is needed, because the inner leads of the imaging device chip are soldered to the film carrier, and the outer leads of the film carrier are soldered to the junction land of the substrate. Charging process of the sealant also has to be carried out after the soldering. Therefore, there is a disadvantage that the imaging device results in increase in cost due to complex manufacturing process for actualizing the complex structure thereof.

SUMMARY OF THE INVENTION

An object of the present invention is to provide an imaging device in which an imaging device chip is securely fixed on a substrate with ease, and the imaging device which contributes to the reduction in thickness of a camera.

Another object of the present invention is to provide an imaging device which achieves dustproof effect on an imaging device chip with simple structure, and contributes to the reduction in thickness of a camera.

To achieve the above objects, the imaging device according to the present invention comprises an imaging device chip with a light receiving surface and chip terminals, and a substrate on which the imaging device chip is fixed. The substrate is provided with substrate terminals which are welded to the chip terminals. An exposure opening for exposing the light receiving surface is formed in the substrate. Since the chip terminals are so welded to the substrate terminals that the imaging device chip is in parallel to the substrate, the imaging device chip is fixed on the substrate. The chip terminals which are solder in the shape of an approximately sphere, a cube, or a plate are arranged on both sides of the light receiving surface, or are arranged around the light receiving surface. The substrate terminals are solder in the shape of an approximately sphere, a cube, or a plate.

A dustproof member is disposed on the imaging device chip in such a manner as to surround the light receiving surface. The dustproof member is elastically deformed to fill a gap between the imaging device chip and the substrate, when the chip terminals are welded to the substrate terminals. The dustproof member is disposed on the outside of the chip terminals, or on the inside of them. The light receiving surface of the imaging device chip may be covered with a cover glass.

The imaging device is manufactured according to the following steps. (a) exposing the light receiving surface through the exposure opening formed in the substrate, (b) making the chip terminals contact with the substrate terminals, (c) aligning the imaging device chip in such a position that the imaging device chip is in parallel to the substrate, while melting the chip terminals and the substrate terminals, and then welding the chip terminals to the substrate terminals.

The imaging device chip is mounted on a holder, and the imaging device chip is aligned by the movement of the holder. An ultrasound generator or a heater is inserted into a slit formed in the holder, and the drive of the ultrasound generator or the heater melts the chip terminals and the substrate terminals. At least one guide projection for guiding the imaging device chip may be provided in the holder. In this case, the alignment of the imaging device chip is carried out by means of pressing the guide projection against the substrate, while the chip terminals and the substrate terminals melt.

According to the above imaging device, it is possible to securely fix the imaging device chip on the substrate with ease, because the chip terminals are instantaneously welded to the substrate terminals after the alignment of the imaging device chip. The camera body becomes thin, because a base board and the like for fixing the imaging device chip on the substrate are unnecessary. Also, using the plate shaped solder land extends a range of contact area of the chip terminal, so that it is possible to prevent poor connection between the chip terminal and the substrate terminal due to misalignment.

The gap between the imaging device chip and the substrate are completely filled up, because the dustproof member disposed around the light receiving surface of the imaging device chip is elastically deformed in fixing the imaging device chip. It is not necessary to dispose another dustproof member in the rearward of the imaging device chip, so that the camera body becomes slim. The light receiving surface is certainly protected from the dust, since the light receiving surface is covered with the cover glass via a spacer.

BRIEF DESCRIPTION OF THE DRAWINGS

The above objects and advantages of the present invention will become apparent from the following detailed descriptions of the preferred embodiments when read in association with the accompanying drawings, which are given by way of illustration only and thus do not limit the present invention. In the drawings, the same reference numerals designate like or corresponding parts throughout the several views, and wherein:

FIG. 11 is a sectional view of an imaging device according to the fifth embodiment;

FIG. 12 is a sectional view showing a condition in which the imaging device of FIG. 11 is secured to a lens barrel;

FIG. 14 is a sectional view of an imaging device according to the sixth embodiment which is secured to a lens barrel;

FIG. 16 is a sectional view showing a condition in which an imaging device according to the seventh embodiment is secured to a lens barrel;

DETAILED DESCRIPTION OF THE EMBODIMENTS (First Embodiment)

Figure 1:
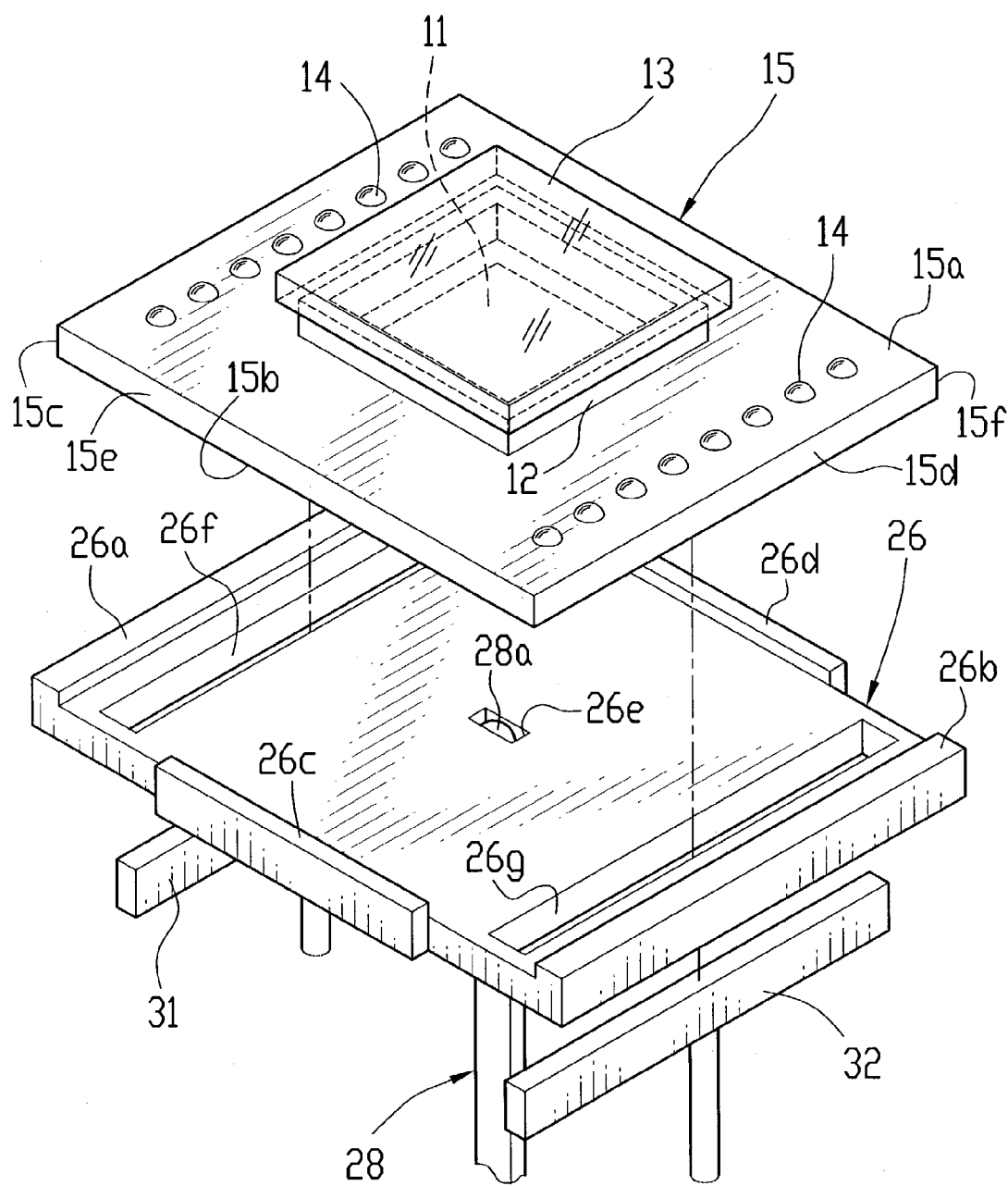
FIG. 1 is a sectional view of a CCD chip, a jig, and ultrasound horns according to a first embodiment.
Figure 2:
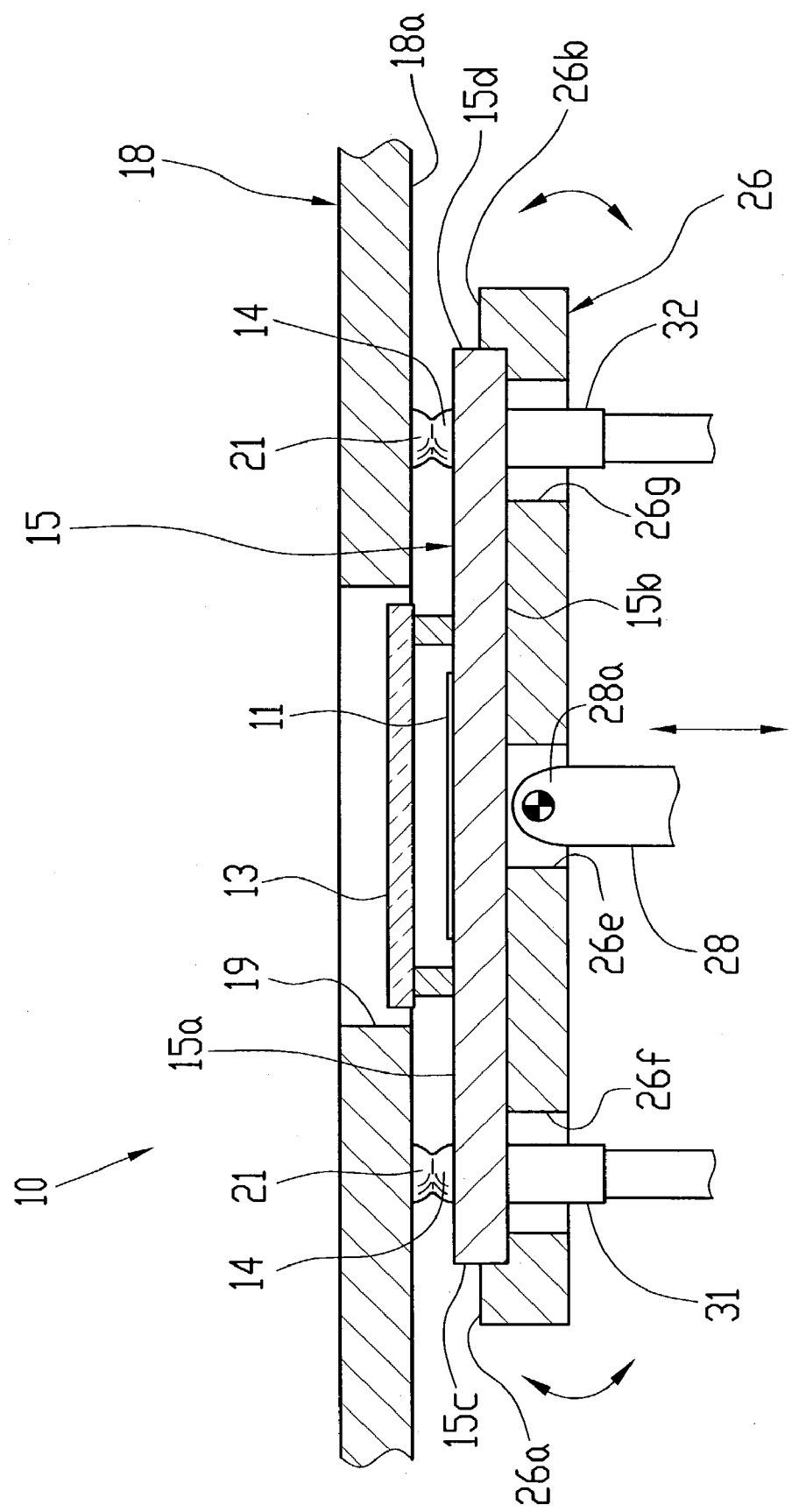
FIG. 2 is a sectional view of an imaging device according to the first embodiment, showing a condition in which the CCD chip of FIG. 1 is fixed on a substrate.

Referring to FIGS. 1 and 2, an imaging device 10 comprises a CCD (charge coupled device) chip 15 and a substrate 18 on which the CCD chip 15 is fixed. A light receiving surface 11 provided in the middle of the CCD chip is covered with a cover glass 13 via a frame shaped spacer 12. On the front surface 15a of the CCD chip 15, plural solder balls as chip terminals 14 are arranged in two lines. The lines of the chip terminals 14 are symmetrically disposed in parallel with each other across the light receiving surface 11.

An opening 19 is formed in the substrate 18. The cover glass 13 fits into the opening 19. On the rear surface 18a of the substrate 18, plural solder balls as substrate terminals 21 are arranged in two lines, which correspond to the lines of the chip terminals 14. Each of the substrate terminals 21 is soldered to the corresponding chip terminal 14. Various parts (not illustrated) for driving the CCD chip 15 are mounted on the substrate 18.

When aligning the CCD chip 15 with the substrate 18, a rectangular jig 26 is applied to the rear surface 15b of the CCD chip 15 from underneath thereof. Protrusions 26a and 26b, which are in contact with the side surfaces 15c and 15d of the CCD chip 15, are formed in a pair of opposite edges of the jig 26. Other protrusions 26c and 26d, which are in contact with the side surfaces 15e and 15f of the CCD chip 15, are formed in the other pair of opposite edges of the jig 26. The height of the protrusions 26a to 26d is lower than the thickness of the CCD chip 15, so that the protrusions 26a to 26d do not hinder the CCD chip 15 from being disposed in parallel with the substrate 18, as described later.

A rectangular opening 26e is formed at the center of the jig 26. The end 28a of an arm stick 28 is inserted into the opening 26e to rotatably hold the arm stick 28. Narrow openings 26f and 26g for inserting ultrasound horns 31 and 32 are formed in the vicinity of the protrusions 26a and 26b of the jig 26.

In fixing the CCD chip 15 on the substrate 18, the CCD chip 15 is mounted on the front surface of the jig 26, and then the jig 26 moves upward to the horizontally fixed substrate 18. After the CCD chip 15 is so aligned with the substrate 18 that each chip terminal 14 comes into contact with the corresponding substrate terminal 21, the ultrasound horns 31 and 32 inserted into the narrow holes 26f and 26g are put to the rear surface 15b of the CCD chip 15.

Upon actuating the ultrasound horns 31 and 32, ultrasound melts the chip terminals 14 and the substrate terminals 21. The chip terminals 14 and the substrate terminals 21 are soldered to each other. During the soldering, the arm stick 28 moves in a perpendicular direction of FIG. 2 to adjust a space between the CCD chip 15 and the substrate 18, and the jig 26 is inclined to make the CCD chip 15 in parallel with the substrate 18.

The position of the CCD chip 15 is adjusted with observing the reflected light of laser beam applied to the light receiving surface 11 with a microscope. The ultrasound horns 31 and 32 are stopped after the adjustment. Then, the chip terminals 14 and substrate terminals 21 solidify immediately in a state of being soldered to each other, so that the CCD chip 15 are fixed on the substrate 18.

According to the imaging device described above, it is possible to securely fix the CCD chip 15 on the substrate 18 with ease after the alignment. As a consequence, a base board and the like for fixing the CCD chip 15 to the substrate 18 are unnecessary, so that it is possible to contribute to the reduction in thickness of a camera.

Figure 3:
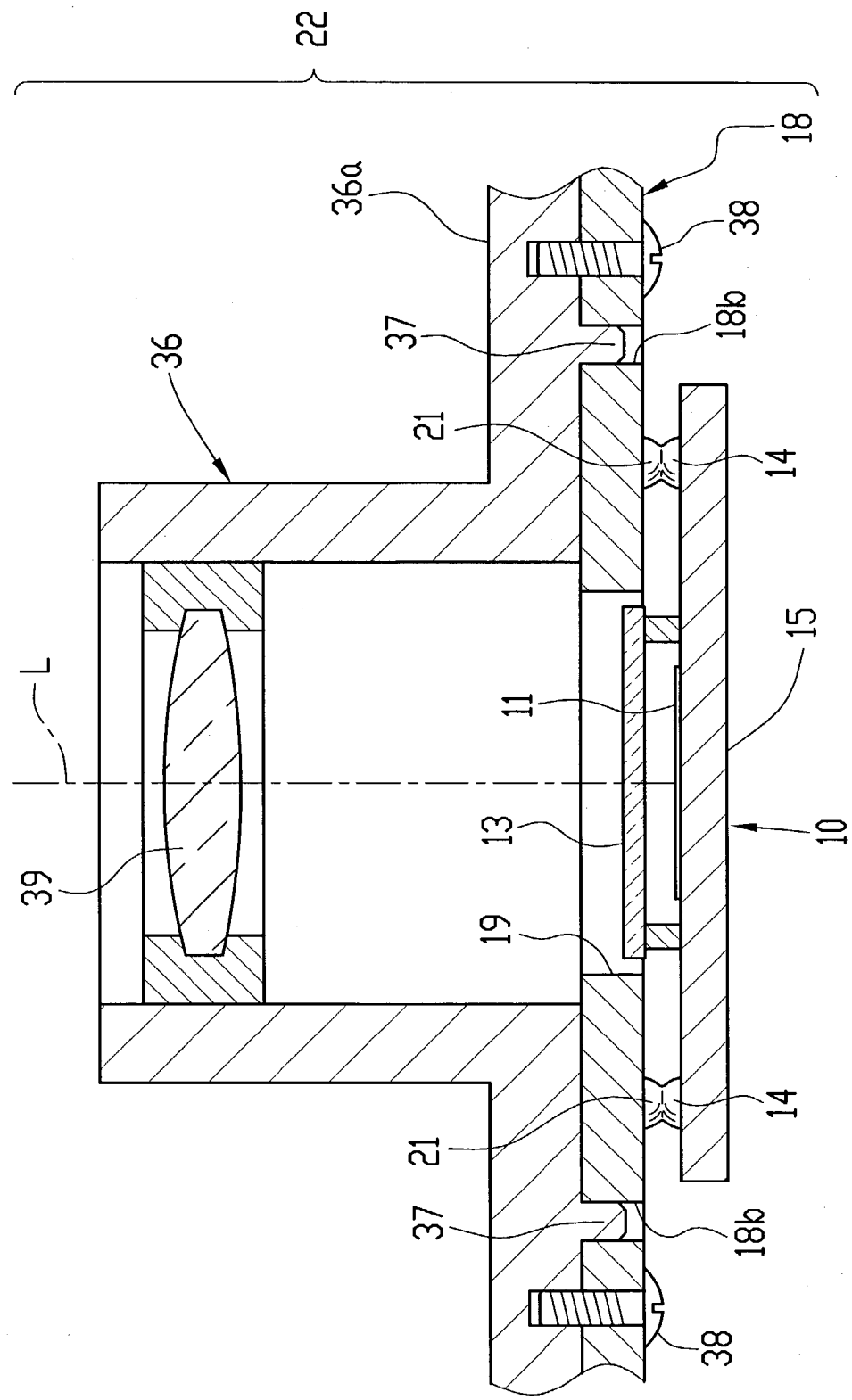
FIG. 3 is a sectional view of the imaging device of FIG. 2 which is secured to a lens barrel.

Referring to FIG. 3, the flange 36a of a lens barrel 36 is provided with plural bosses 37 for alignment. The substrate 18 has holes 18b into which the bosses 37 are fitted. The substrate 18 tightly makes contact with the inner surface of the flange 36a, and then the substrate 18 is secured to the lens barrel 36 with plural screws. Accordingly, the light receiving surface 11 becomes perpendicular to the optical axis L of a taking lens 39.

The chip terminals 14 arranged on the front surface 15a of the CCD chip 15 and substrate terminals 21 arranged on the rear surface 18a of the substrate 18 may include dummy chip terminals and dummy substrate terminals, respectively. The dummy chip terminals and the dummy substrate terminals are used only for welding.

The imaging device 10 secured to the lens barrel 36 is installed in a digital camera, a camera-equipped mobile phone, and the like as a lens unit 22.

(Second Embodiment)

Figure 4:
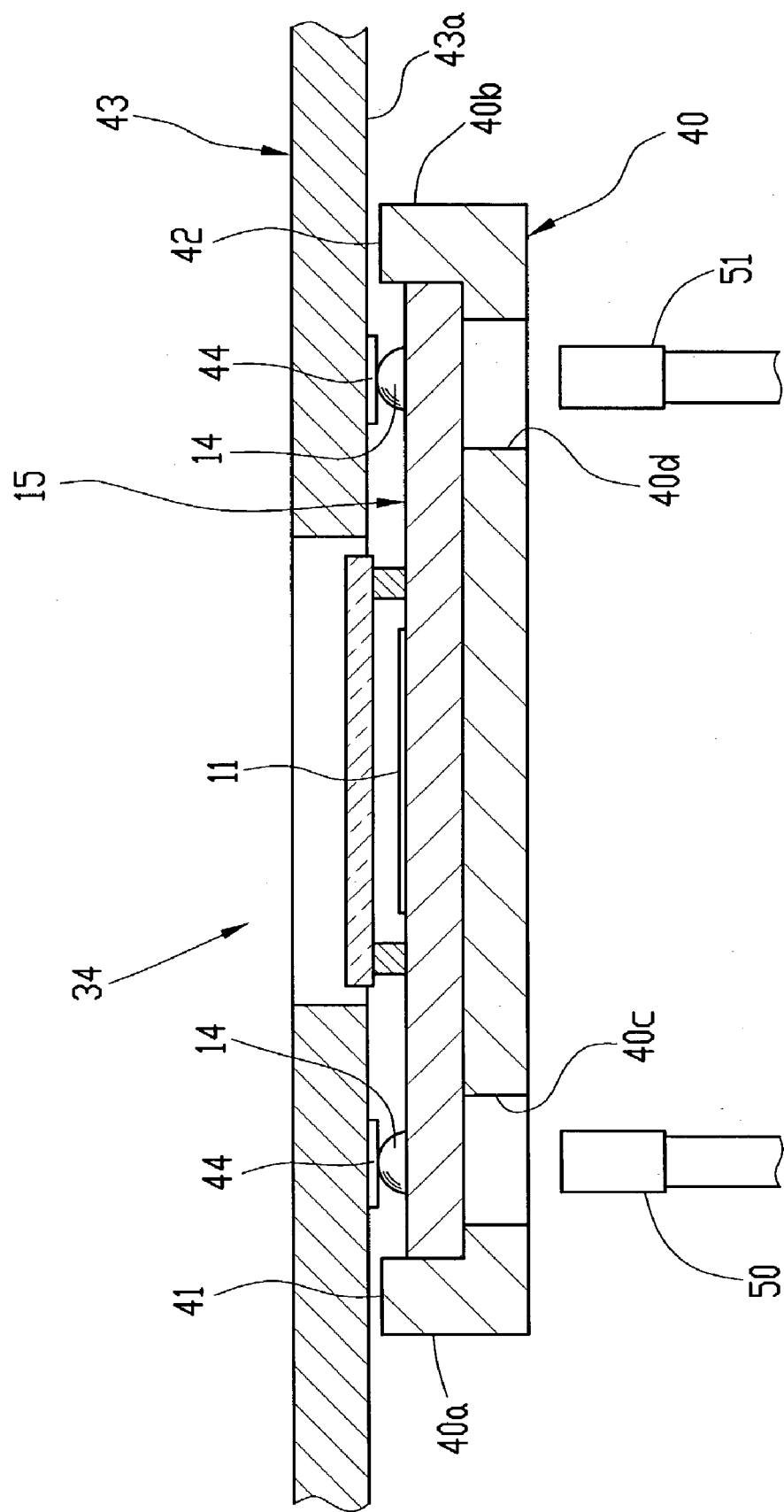
FIG. 4 is a sectional view showing a condition just before a CCD chip according to a second embodiment is ultrasonically welded to a substrate.
Figure 5:
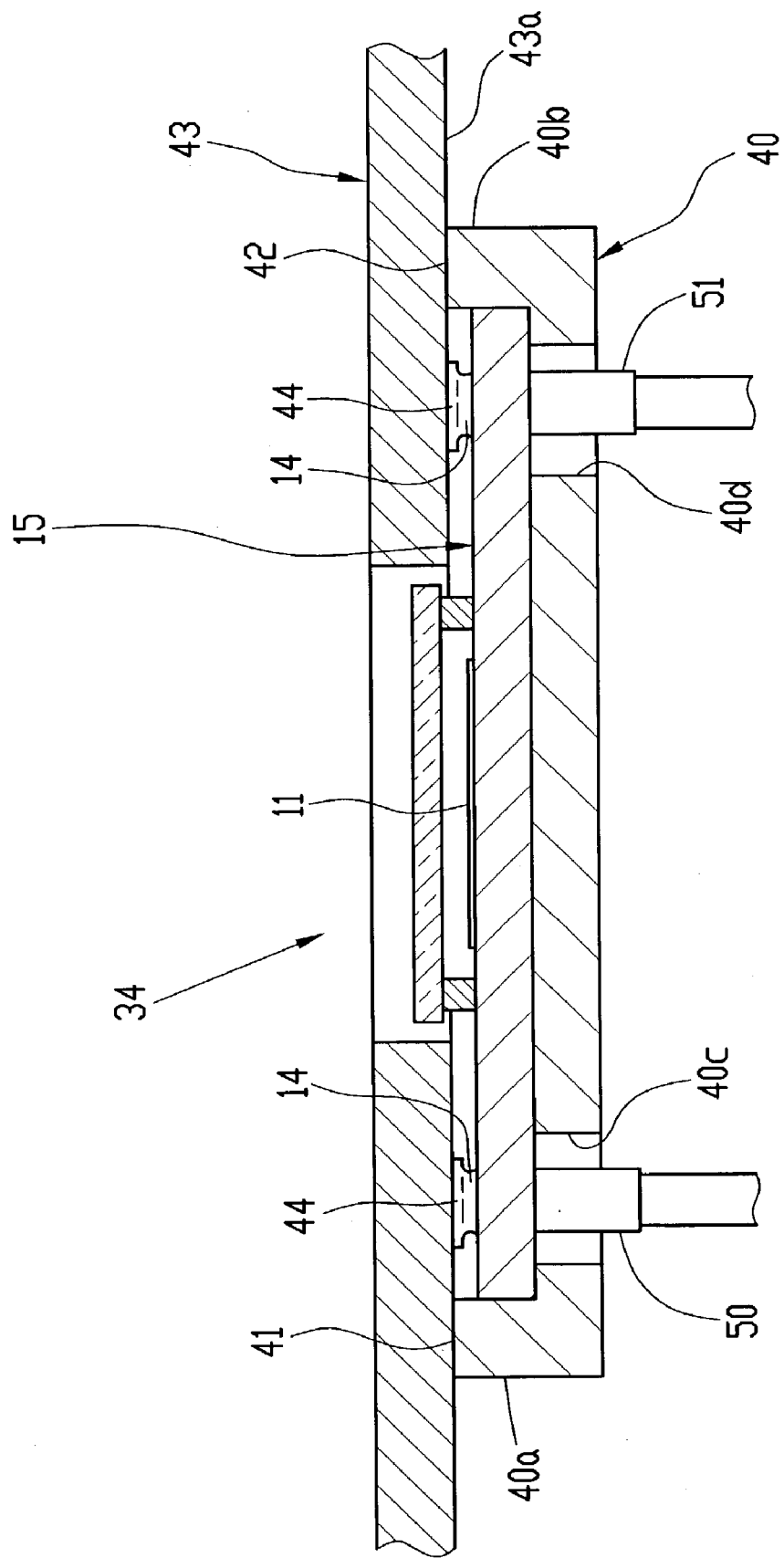
FIG. 5 is a sectional view of an imaging device according to the second embodiment, showing a condition in which the CCD chip of FIG. 4 is fixed on the substrate.

Referring to FIGS. 4 and 5, an imaging device according to the second embodiment comprises the CCD chip 15 which is identical with that of the first embodiment, and a substrate 43 on which the CCD chip 15 is fixed. The substrate terminals 44 arranged on the substrate 43 are not solder balls as described in the first embodiment but plate shaped solder lands. The contact area of the chip terminal 14 with the solder land 44 is larger than that with the solder ball. Accordingly, the chip terminals 14 securely come into contact with the substrate terminals 44, so that a wide range of manufacturing error is allowable in comparison with a case of the solder balls.

A jig 40 is similar to that of the first embodiment in shape, but at least one pair of opposite protrusions 40a and 40b is higher than the thickness of the CCD chip 15. When the CCD chip 15 is mounted on the jig 40, the chip terminals 14 protrude from the protrusions 40a and 40b, because the chip terminals 14 are higher than the protrusions 40a and 40b. The top surfaces 41 and 42 of the protrusions 40a and 40b are formed flat. Narrow openings 40c and 40d for inserting electric heaters 50 and 51 with a resistance line are formed in the vicinity of the protrusions 40a and 40b of the jig 40. The ultrasound horns may be used instead of the electric heaters 50 and 51.

The jig 40 is movable in a perpendicular direction of FIG. 4, and the substrate 43 is fixed in a predetermined position above the jig 40. The jig 40 on which the CCD chip 15 is mounted moves upward and stops at a position in which the chip terminals 14 come into contact with the corresponding substrate terminals 44. Then, the electric heaters 50 and 51 are driven to partially heat the chip terminals 14 and the substrate terminals 44.

Since the chip terminals 14 and the substrate terminals 44 melt, as shown in FIG. 5, the jig 40 further moves upward. The jig 40 is pressed against the rear surface 43a of the substrate 43, until the flat top surfaces 41 and 42 of the protrusions 40a and 40b come into contact with the rear surface 43a of the substrate 43. In this way, the CCD chip 15 is aligned in parallel with the substrate 43 with leaving a predetermined space. Upon stopping the electric heaters 50 and 51, the chip terminals 14 and the substrate terminals 44 immediately solidify, so that the CCD chip 15 is fixed on the substrate 43.

(Third Embodiment)

Figure 6:
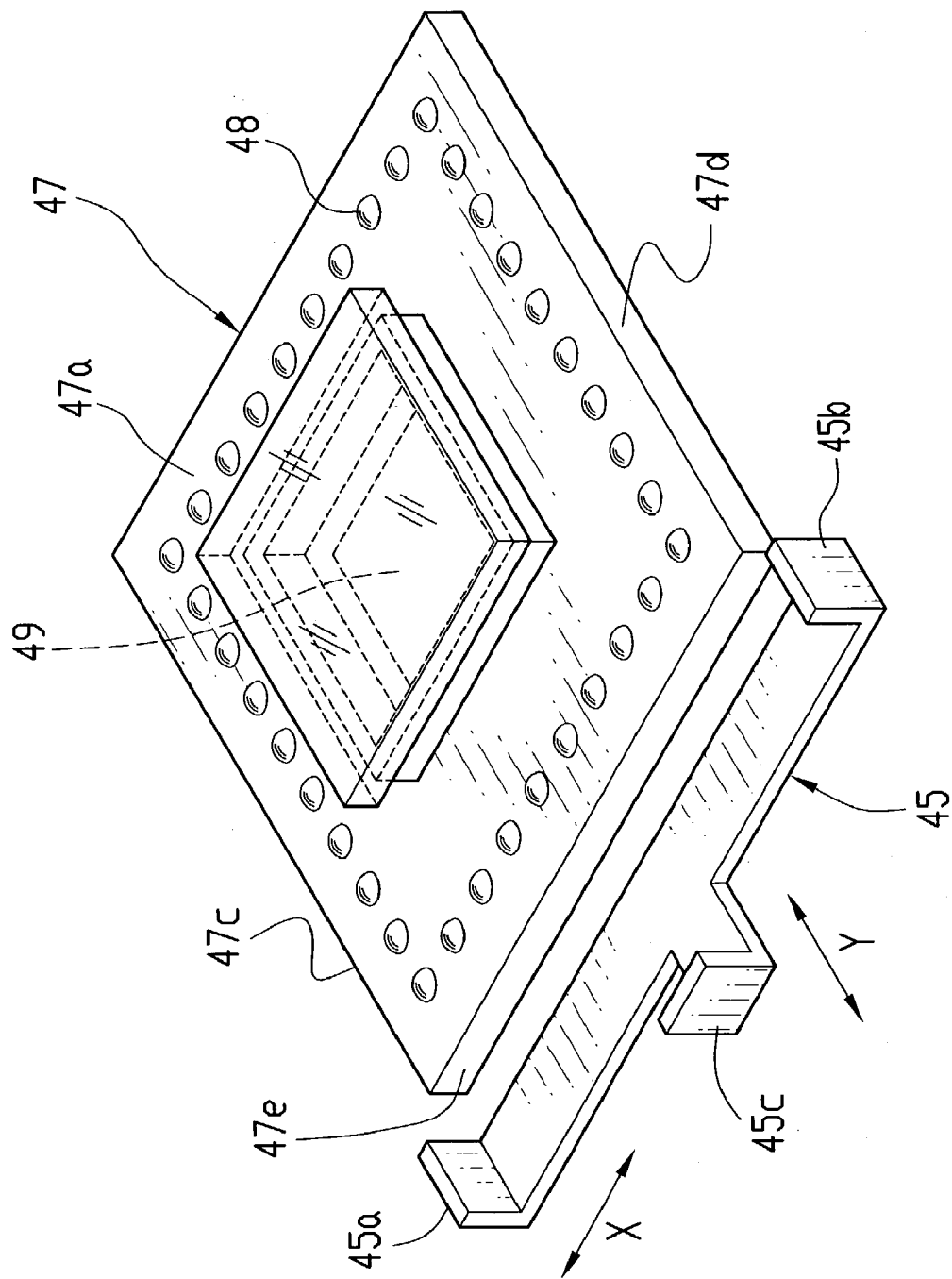
FIG. 6 is a perspective view of a CCD chip and a jig according to a third embodiment.

FIG. 6 shows a CCD chip 47 composing an imaging device according to the third embodiment. Chip terminals 48 are so arranged on the front surface 47a of the CCD chip 47 as to surround a light receiving surface 49.

A T-shaped jig 45 the ends 45a to 45c of which bend perpendicularly is used for fixing the CCD chip 47 on a substrate. When the jig 45 moves in X and Y directions on a horizontal plane, the ends 45a to 45c make contact with the side surfaces 47c, 47d, and 47e of the CCD chip 47 respectively, in order to move the CCD chip 47 in the X and Y directions too. The substrate is provided with substrate terminals which correspond to the chip terminals 48. The CCD chip 47 is fixed on the substrate by the ultrasound or the partial heating, as in the case of the first or second embodiment.

(Fourth Embodiment)

Figure 7:
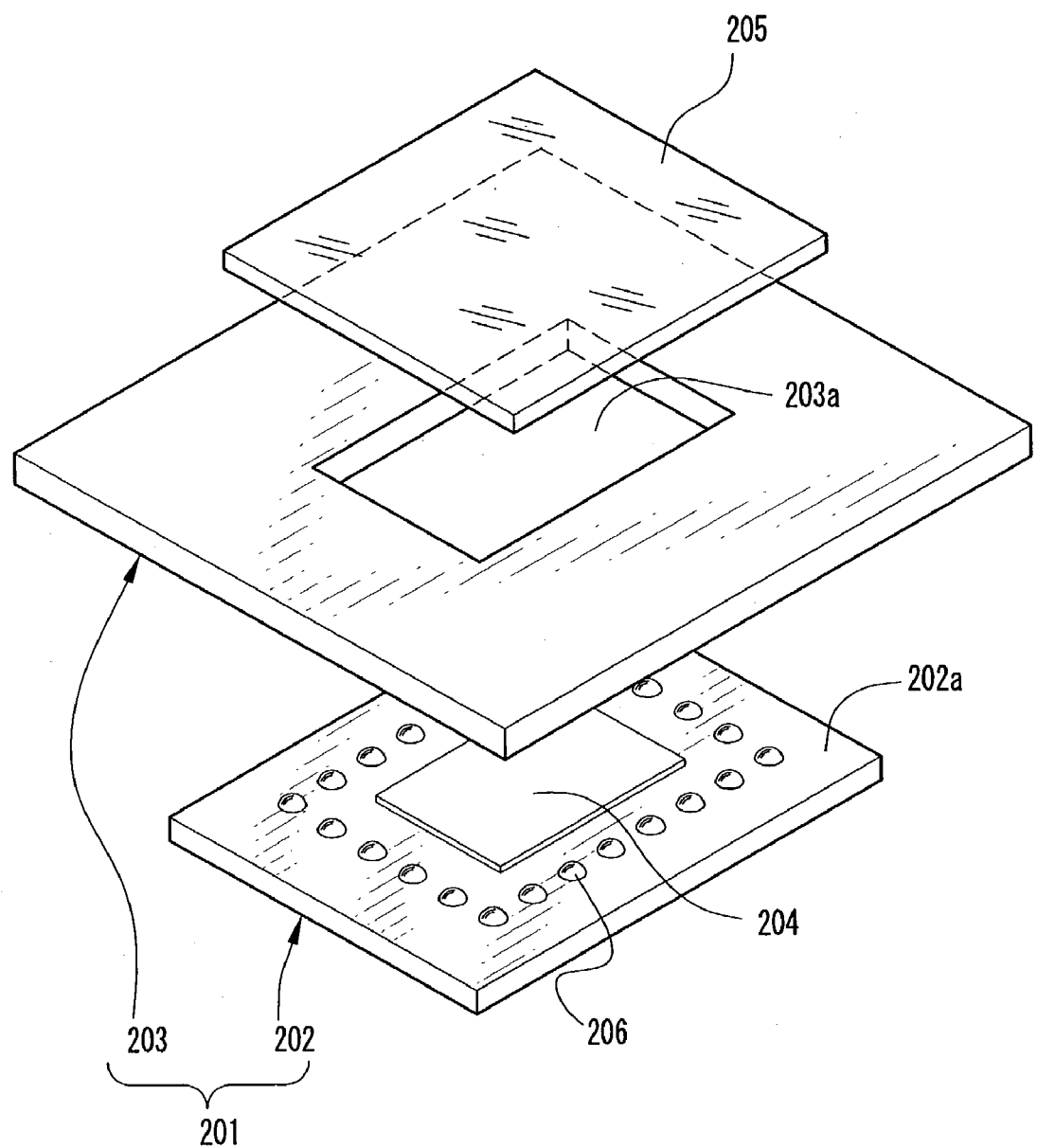
FIG. 7 is an exploded perspective view of an imaging device according to a fourth embodiment.

Referring to FIG. 7, an imaging device 201 according to the fourth embodiment comprises a CCD chip 202, and a substrate 203 on which the CCD chip 202 is fixed in parallel. An opening 203a formed in the substrate 203 for exposing a light receiving surface 204 is covered with a plate of cover glass 205.

The CCD chip 202 is fixed on the substrate 203 in the same manner as the first to third embodiments. Chip terminals 206 arranged on the front surface of the CCD chip 202 may include dummy chip terminals. Substrate terminals 207 arranged on the rear surface 203b of the substrate 203 may include dummy substrate terminals. The dummy chip terminals and the dummy substrate terminals are used for only welding.

Figure 8:
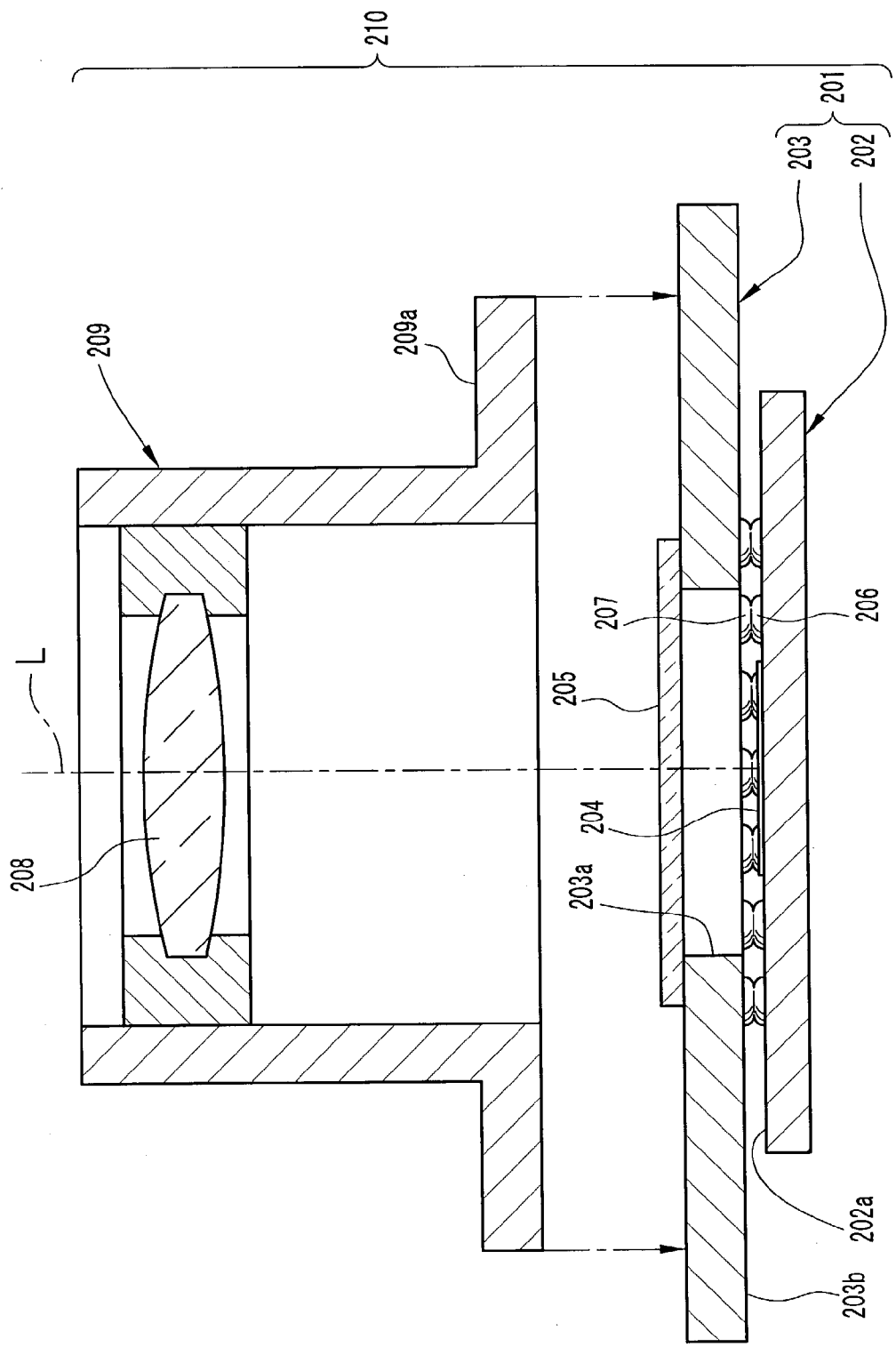
FIG. 8 is a sectional view of the imaging device of FIG. 7 which is secured to a lens barrel.

The imaging device 201 is secured to a flange 209a of a lens barrel 209 holding a taking lens 208 with an adhesive such as epoxy resin and the like, as shown in FIG. 8, so that the adhesion of dust to the cover glass is prevented. The imaging device 201 secured to the lens barrel 209 is installed in a digital camera, a camera-equipped mobile phone, or the like as a lens unit 210.

The cover glass 205 for covering the light receiving surface 204 through the opening 203a may be omitted. Screws and the like may be used instead of the adhesive.

As described above, according to the imaging device of the first to fourth embodiments, it is possible to securely fix the imaging device chip on the substrate with ease. According to a fixing method described above, it is possible to slim the camera because any base board for fixing the CCD chip to the substrate is not necessary.

In the above embodiments, however, minute dust getting into the camera from a gap between the imaging device chip and the substrate tends to adhere to the light receiving surface of the imaging device chip or the front surface of the cover glass. From the viewpoint of this, embodiments of an imaging device with dustproof effect will be hereinafter described.

(Fifth Embodiment)

Figure 9:
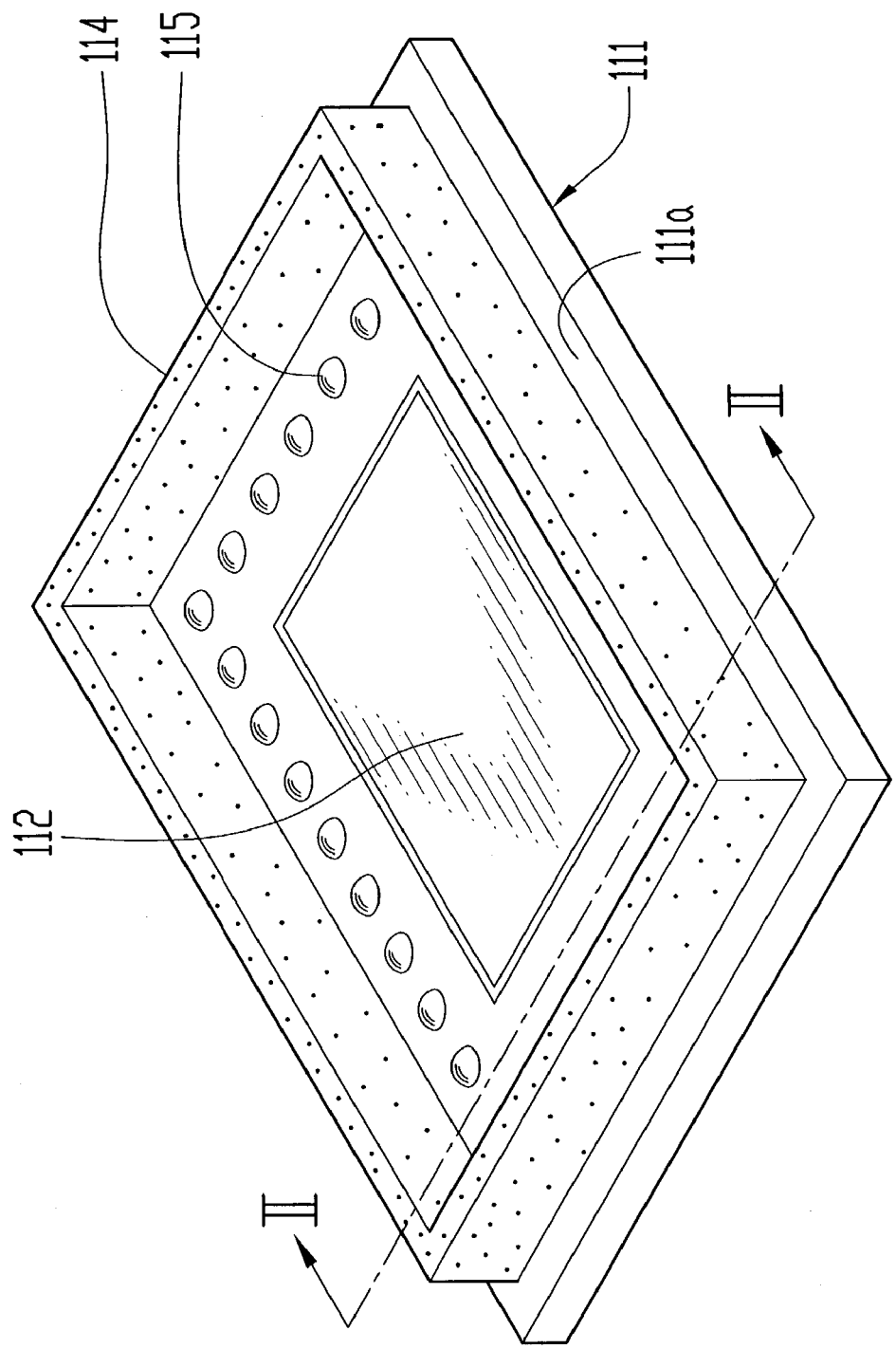
FIG. 9 is a perspective view of a CCD chip according to a fifth embodiment.
Figure 10:
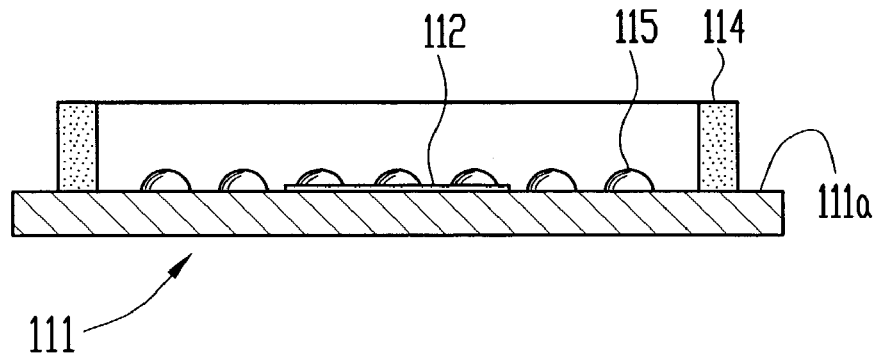
FIG. 10 is a sectional view of the CCD chip of FIG. 9.

Referring to FIGS. 9 to 11, an imaging device unit 100 according to the fifth embodiment comprises a CCD chip 111 and a substrate 116 on which the CCD chip 111 is soldered.

A light receiving surface 112 is provided in the front surface 111a of the CCD chip 111. A frame shaped dustproof member 114 made out of rubber is attached around the light receiving surface 112. Chip terminals 115 are so arranged in square between the light receiving surface 112 and the dustproof member 114 as to surround the light receiving surface 112.

The CCD chip 111 with the dustproof member 114 is fixed on the rear surface 116a of the substrate 116 for driving the CCD chip 111. On the rear surface 116a, substrate terminals 117 are provided. The positions of the substrate terminals 117 correspond with those of the chip terminals 115, and the number of the substrate terminals 117 is the same as that of the chip terminals 115.

When the CCD chip 111 is pressed against the rear surface 116a of the substrate 116 with equable force in such a manner that the chip terminals 115 make contact with the corresponding substrate terminals 117, the dustproof member 114 is elastically deformed. The top surface of the dustproof member 114 makes tightly contact with the rear surface 116a of the substrate 116. When the ultrasound horns are put to the CCD chip 111 from a CCD chip 111 side under this condition, for the purpose of applying the ultrasound to the chip terminals 115, the chip terminals 115 and the substrate terminals 117 are welded to each other. Since the elastic repulsion of the dustproof member 114 is weaker than the adhesion of welding between the chip terminals 115 and substrate terminals 117, the CCD chip 111 is fixed on the rear surface 116a of the substrate 116 in parallel with the substrate 116.

An opening 118 for exposing the light receiving surface 112 is formed in the substrate 116. A holder 120 for holding a cover glass 119 is attached to the periphery of the opening 118. The cover glass 119, attached to the edges of an opening 120a formed in the holder 120, covers the light receiving surface 112 from above the substrate 116 in a dustproof manner.

In this way, the light receiving surface 112 which is completely enclosed with the dustproof member 114 and the cover glass 119 is protected from the dust.

The imaging device 100, as shown in FIG. 12, is secured to a flange 122a of a lens barrel 122 holding a taking lens 121, in such a manner that an optical axis L is perpendicular to the light receiving surface 112.

(Sixth Embodiment)

Figure 13:
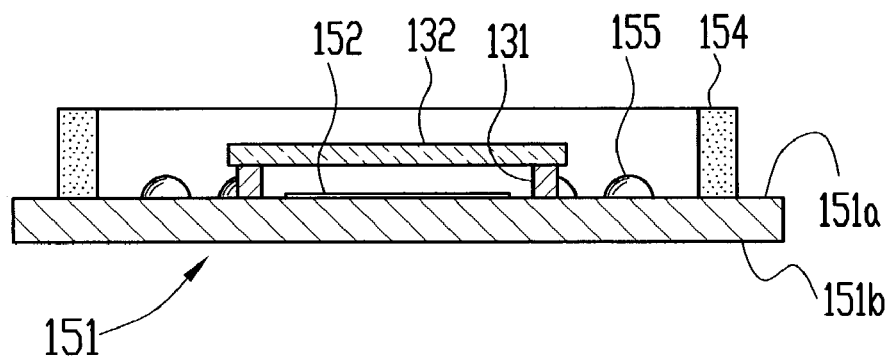
FIG. 13 is a sectional view of a CCD chip according to a sixth embodiment.

Referring to FIGS. 13 and 14, an imaging device 130 according to the sixth embodiment comprises a CCD chip 151 and a substrate 133 on which the CCD chip 151 is soldered. A light receiving surface 152 is provided in the front surface 151a of the CCD chip 151. The light receiving surface 152 is covered with a cover glass 132 via a ceramic spacer 131. A frame-shaped dustproof member 154 made out of rubber is attached around the light receiving surface 152. Chip terminals 155 are so arranged in square between the light receiving surface 152 and the dustproof member 154 as to surround the light receiving surface 152.

As shown in FIG. 14, an opening 134 in which the cover glass 132 is fitted with side play is formed in the substrate 133. On the rear surface 133a of the substrate 133, there are substrate terminals 135, the positions of which correspond with those of the chip terminals 155, and the number of which is the same as that of chip terminals 155.

When the CCD chip 151 is so pressed against the rear surface 133a of the substrate 133 with equable force that the corresponding chip terminals 155 and the substrate terminals 135 come into contact with each other, the dustproof member 154 is elastically deformed, and the top surface of the dustproof member 154 tightly makes contact with the rear surface 133a of the substrate 133. The cover glass 132 is fitted into the opening 134 formed in the substrate 133. The dustproof member 154 prevents dust from getting into the imaging device 130. According to this embodiment, it is possible to contribute to the reduction in thickness of a camera, because the dustproof member 154 does not need any parts or sealant on the rear side of the CCD chip 151.

Then, the ultrasound horns are put on the rear surface 151b of the CCD chip 151 under this condition, in order to apply ultrasound to the chip terminals 155 and the substrate terminals 135. The chip terminals 155 and the substrate terminals 135 are welded to each other, and the CCD chip 151 is fixed on the rear surface 133a of the substrate 133 in parallel with the substrate 133. The light receiving surface 152 becomes perpendicular to an optical axis L of a taking lens 137, and the distance between the light receiving surface 152 and the taking lens 137 becomes within a predetermined range.

(Seventh Embodiment)

Figure 15:
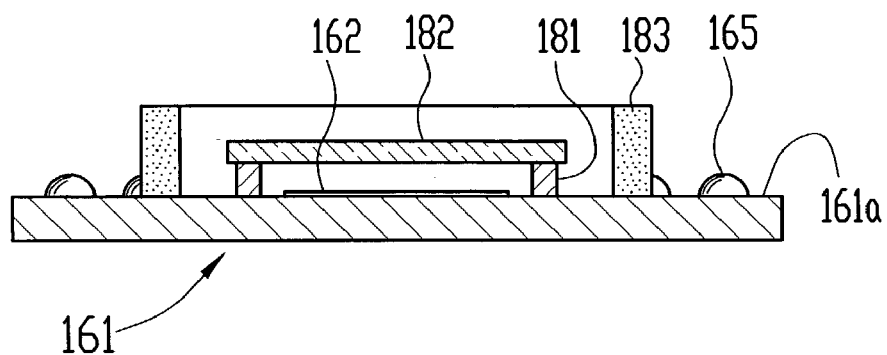
FIG. 15 is a sectional view of a CCD chip according to a seventh embodiment.

Referring to FIGS. 15 and 16, an imaging device 160 according to the seventh embodiment comprises a CCD chip 161 and a substrate 163 on which the CCD chip 161 is soldered. A light receiving surface 162 is provided in the front surface 161a of the CCD chip 161. The light receiving surface 162 is covered with a cover glass 182 via a ceramic spacer 181. Chip terminals 165 are provided near the edges of the CCD chip 161. A frame-shaped dustproof member 183 made out of rubber is disposed between the chip terminals 165 and the cover glass 182. The CCD chip 161 is attached to the substrate 163, as in the case of the CCD chip 151 of the sixth embodiment, the positions of substrate terminals 166 provided on the substrate 163 correspond with those of the chip terminals 165 provided on the CCD chip 161.

Referring to FIG. 16, the imaging device 160 is secured to a flange 171a of a lens barrel 171 which holds a taking lens 170 in such a manner that an optical axis L is perpendicular to a light receiving surface 162. There are dummy chip terminals 168 arranged on the CCD chip 161, in addition to the effective chip terminals 165 for driving. The dummy chip terminals 168 used for only welding is disposed at each corner of the CCD chip 161. Dummy substrate terminals 169 corresponding to the dummy chip terminals 168 are provided on the substrate 163.

In this embodiment, the spacer 181 is made out of the ceramic, but it is possible to make the spacer out of aluminum, hard plastic, or the like.

(Eighth Embodiment)

Figure 17:
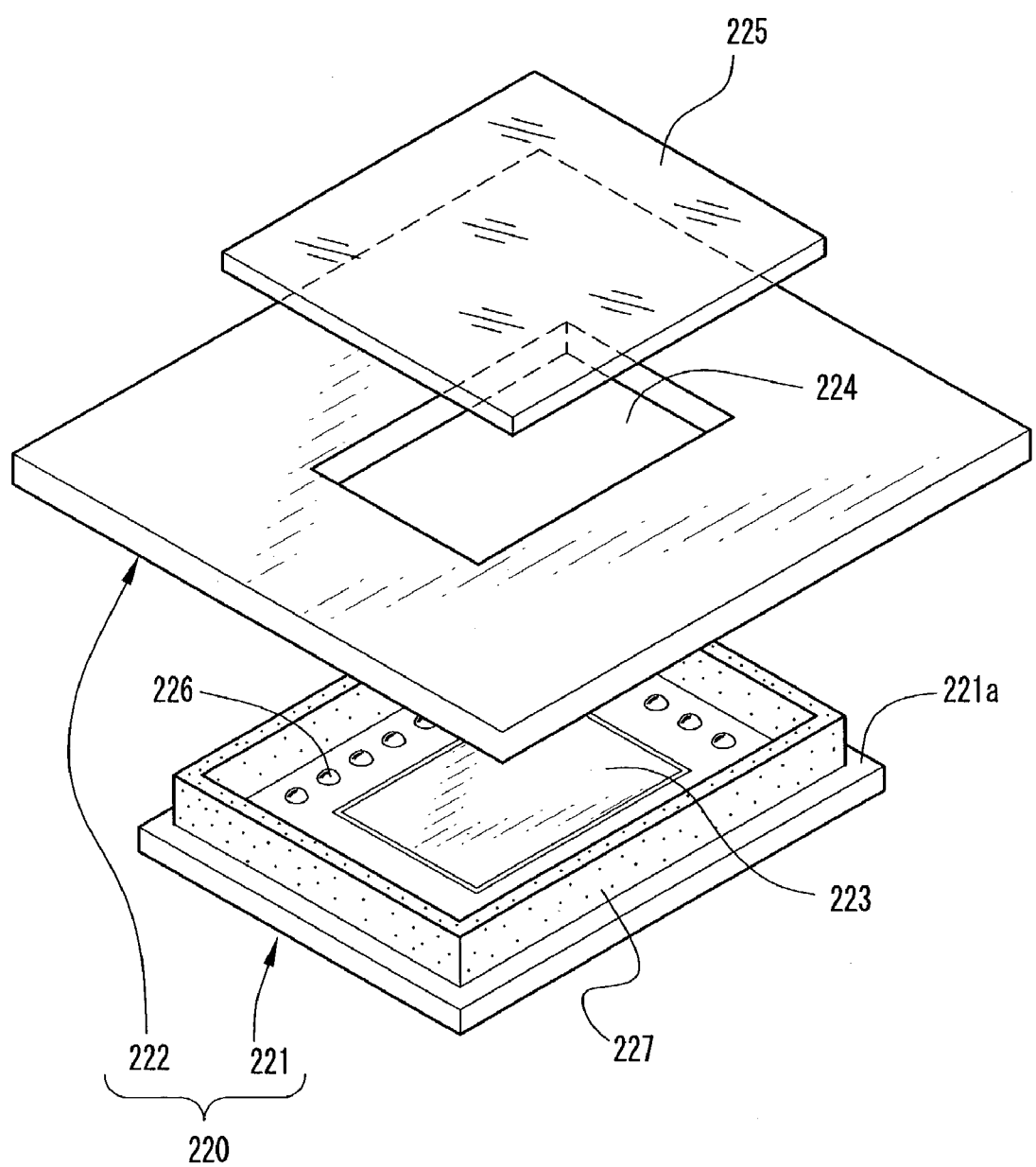
FIG. 17 is an exploded perspective view of an imaging device according to an eighth embodiment.
Figure 18:
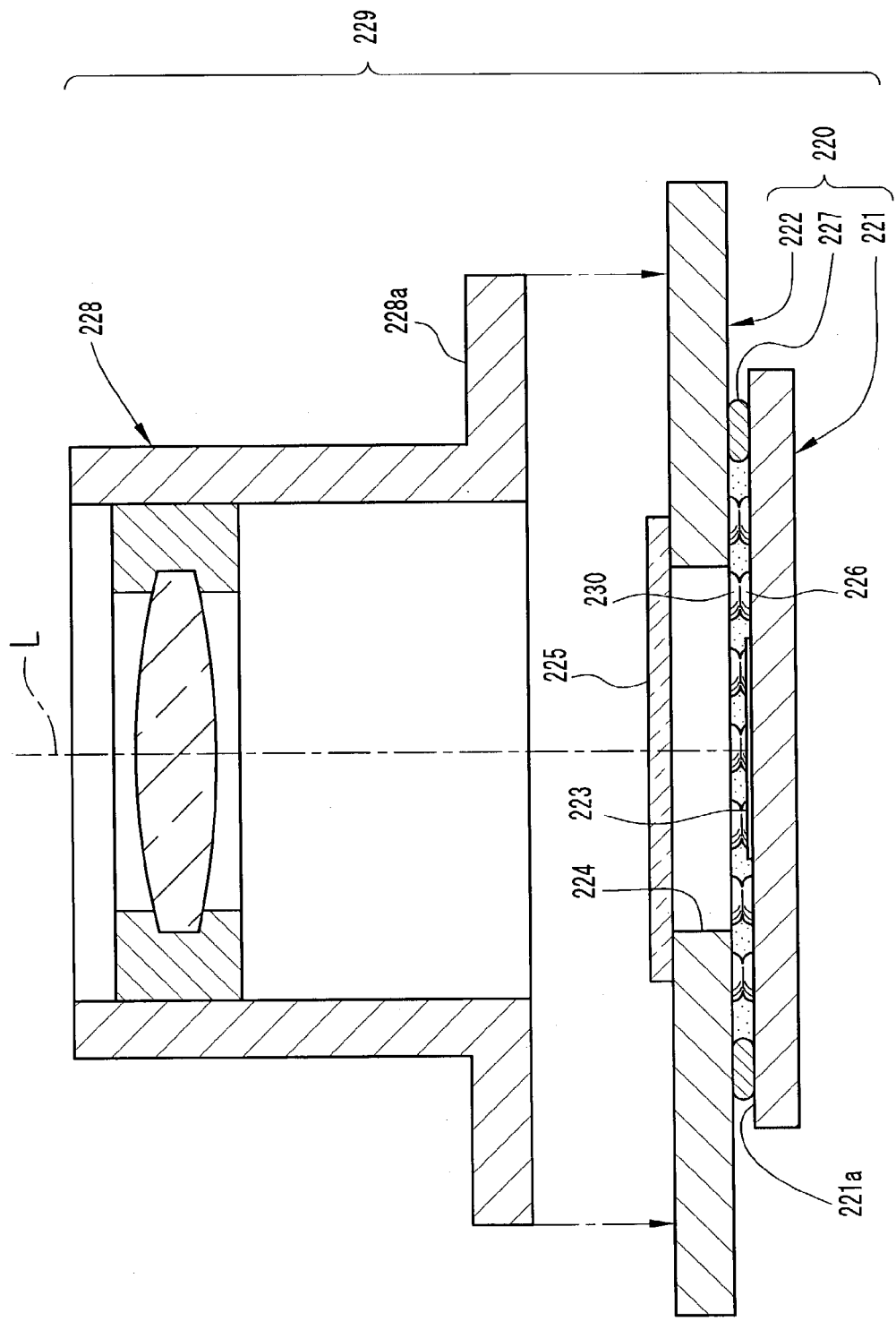
FIG. 18 is a sectional view showing a condition in which the imaging device of FIG. 17 is secured to a lens barrel.

Referring to FIGS. 17 and 18, an imaging device 220 according to the eighth embodiment comprises a CCD chip 221 and a substrate 222 on which the CCD chip 221 is fixed. An opening 224 for exposing a light receiving surface 223 of the CCD chip 221 is formed in the substrate 222. The opening 224 is covered with a plate of dustproof cover glass 225. A frame shaped dustproof member 227 is attached in advance on the outside of chip terminals 226. When the chip terminals 226 are welded to substrate terminals 230 provided on the substrate 222, as in the case of the above embodiments, the dustproof member 227 fills a gap between the CCD chip 221 and the substrate 222 in order to prevent dust from adhering to the light receiving surface 223.

The imaging device 220 is so secured to a flange 228a of a lens barrel 228 with an adhesive, screws or the like, as shown in FIG. 18, that the adhesion of dust to the cover glass 225 is prevented. A lens unit 229 comprising the lens barrel 228 and the imaging device 220 is installed in a digital camera, a camera-equipped mobile phone or the like. Since the lens barrel 228 seals the cover glass 225 side of the imaging device 220 against the dust, the cover glass 225 may be omitted. The following ninth embodiment will describe an imaging device without the cover glass.

(Ninth Embodiment)

Figure 19:
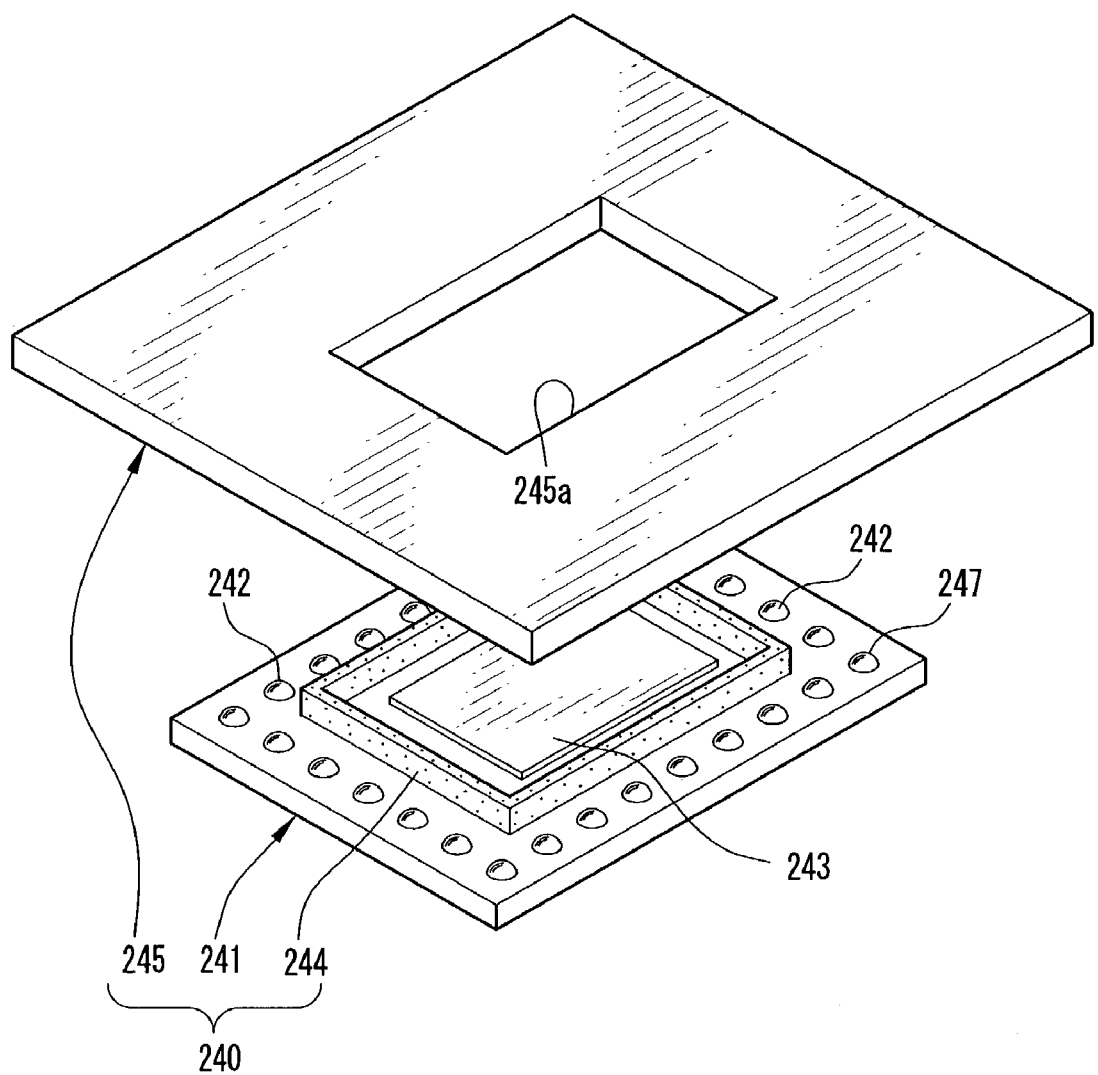
FIG. 19 is an exploded perspective view of an imaging device according to a ninth embodiment.

Referring to FIG. 19, a CCD chip 241 of an imaging device 240 according to the ninth embodiment has a dustproof member 244 disposed between chip terminals 242 and a light receiving surface 243. Substrate terminals (not illustrated) of a substrate 245, on which the CCD chip 241 is fixed, are arranged in such positions as to correspond with the chip terminals 242. The CCD chip 241 is provided with dummy chip terminals 247 used for only welding, besides the effective chip terminals 242 used for driving. The dummy chip terminals 247 are disposed at four corners of the CCD chip 241. The substrate 245 is provided with dummy substrate terminals (not illustrated) which correspond to the dummy chip terminals 247. The imaging device 240 of this embodiment does not have a dustproof cover glass. The light receiving surface 243, however, is protected from dust, as with the above embodiments, because the imaging device is tightly secured to a lens barrel.

In the above embodiments, the dustproof member is made out of the rubber, but it may be made out of an elastomer. The dustproof member is rectangular in shape, but the present invention is not limited to it. The dustproof member may be round in shape.

In the above embodiments, the ultrasound is applied to the CCD chip from the rear side thereof, but it may be applied from a substrate side. The ultrasound horns or the electric heaters are used for melting the chip terminals and the substrate terminals, but any device may be used as long as it can carry out partial heating.

The chip terminals are arranged in the parallel two lines across the light receiving surface, or arranged in a single square line surrounding the light receiving surface, but the present invention is not limited to this. It may be possible to arrange the chip terminals in two or more square lines, for example, namely in the shape of a ball grid array. The chip terminals and the substrate terminals are not limited to the solder balls, but may be a cube in shape, for example, as long as they are made out of solder.

In the above embodiment, the substrate terminals are the plate shaped solder lands, and the chip terminals are the solder balls. The chip terminals, however, may be the plate shaped solder lands, and the substrate terminals are the solder balls. Either the chip terminals or the substrate terminals may be made out of the solder, while the other may be made out of metal which does not melt. In the above embodiments, the CCD chip is used as the imaging device chip, but CMOS chip may be used.

The imaging devices according to the first to ninth embodiments described above are used with being installed in an electronics device such as a digital camera and a camera-equipped mobile phone, for example.

Figure 20:
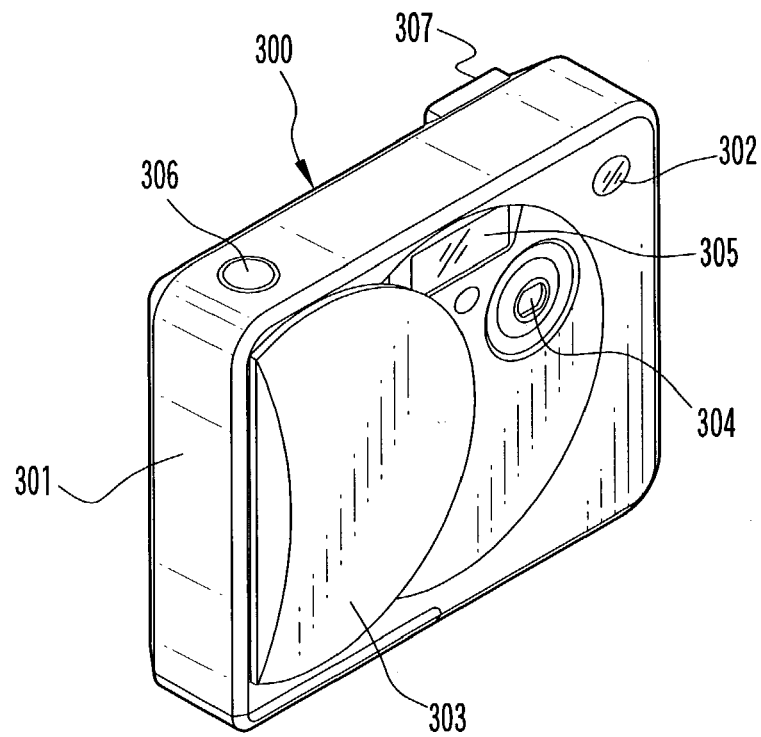
FIG. 20 is a front perspective view of a digital camera in which an imaging device according to the present invention is installed.

Referring to FIG. 20, the imaging device 10 according to the first embodiment is installed in a camera body 301 of a digital camera 300. A viewfinder objective window 302 is provided in the upper right portion of the front wall of the camera body 301. A semicircular lens barrier 303 which is slidable in a horizontal direction is provided in the middle of the camera body 301. Sliding operation of the lens barrier 303 exposes a taking lens 304, a flash projector 305, and the like which are disposed beneath the lens barrier 303. There is a shutter button 306 provided in the top wall of the camera body 301.

Figure 21:
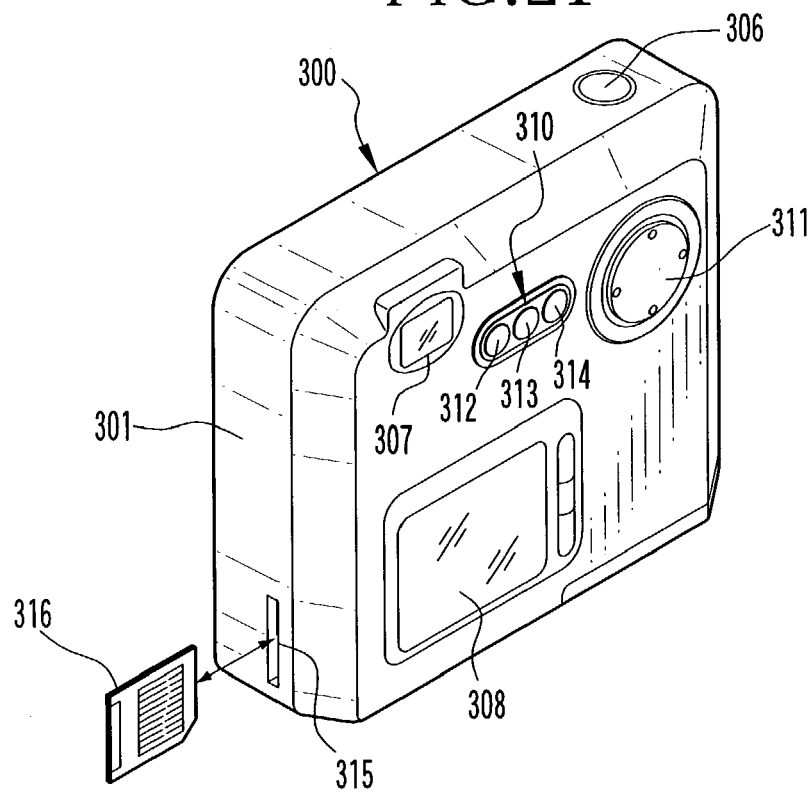
FIG. 21 is a rear perspective view of the digital camera of FIG. 20.

Referring to FIG. 21, a viewfinder eyepiece window 307, an LCD (liquid crystal display) 308, an operating section 310 having various operation buttons 312 to 314, and a cursor operation button 311 are provided in the rear wall of the camera body 301. When the digital camera 300 is in a photography mode, the LCD 308 is used as an electronic viewfinder on which a subject image through a taking lens is displayed. When the digital camera 300 is in a playback mode, the LCD 308 displays a recorded playback image. When the digital camera 300 is in a setup mode, the LCD 308 displays various setting windows.

The operating section 310 has a power switch 312, a mode selection button 313, and a decision button 314. The digital camera 300 is turned on and off by a press of the power switch 312. The mode selection button 313 is used for switching among the photography mode for making an exposure, the playback mode for displaying the recorded image, the setup mode for setting up various settings, and the like. The decision button 314 is used for deciding an alternative chosen in the setup mode and the like.

Press operating sections provided at four locations of upper, lower, right and left sides of the circular cursor operation button 311 are used for moving a cursor displayed on the LCD 308 from side to side or up and down.

Operation from the operating section 310 and the cursor operation button 311 variously sets up and operates the digital camera 300. When the digital camera 300 is set in the setup mode by the press of the mode selection button 313, for example, a user moves the cursor to any applicable menu entry among the menu entries displayed on the setting window of the LCD 308, and presses the decision button 314. Accordingly, the applicable menu entry is chosen, and various types of operation are carried out.

A slot 315 into which a memory card 316 is inserted is formed in the sidewall of the camera body 301. A flash memory, which is a nonvolatile semiconductor memory, is used as the memory card 316. The memory card 316 has a record area in which the data of the recorded image is stored, and a file management area in which the data for managing the recorded image is stored.

Figure 22:
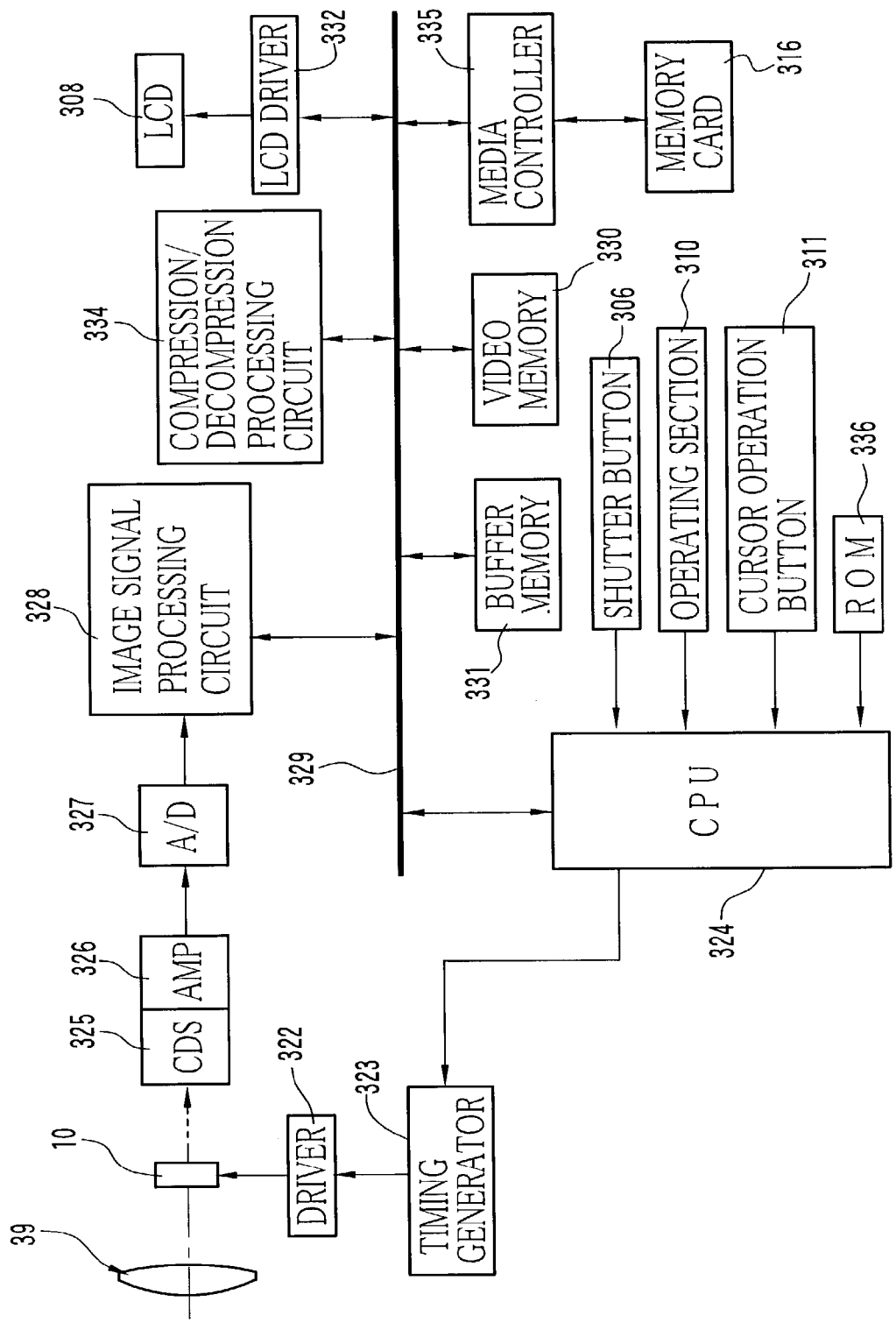
FIG. 22 is a block diagram showing an electrical configuration of the digital camera of FIG. 20.

Referring to FIG. 22 showing an electrical configuration of the digital camera 300, the imaging device 10 according to the present invention is disposed in the rearward of the taking lens 39. The imaging device 10 is secured to the flange 36a of the lens barrel 36 holding the taking lens 39 (refer to FIG. 3). It is preferable that the taking lens 39, the lens barrel 36, and the imaging device 10 are installed in the camera body 301 as an integral lens unit.

The CPU 324 controls the operation of the imaging device 10 via a timing generator 323 for generating clock signals and a driver 322. The CCD chip 15 of the imaging device 10 converts light from the subject passing through the taking lens 39 into image pickup signals. The substrate 18 of the imaging device 10 may include the driver 322.

The image pickup signals outputted from the imaging device 10 are inputted to a correlated double sampling circuit (CDS) 325. The image pickup signals are divided into RGB image signals which precisely correspond to an amount of accumulated electric charge of each cell of the CCD chip 15. An amplifier (AMP) 326 amplifies the image signals outputted from the CDS 325, and then an analog-to-digital converter 217 converts them into digital image data. The image data is inputted to an image signal processing circuit 328. The image signal processing circuit 328 connected to a video memory 330 and a buffer memory 331 via a data bus 329 writes the image data to each of the video memory 330 and the buffer memory 331.

When the LCD 308 is used as the electronic viewfinder, the image data with low resolution is temporarily stored in the video memory 330. The image data stored in the video memory 330 is sent to an LCD driver 332 via the data bus 329, and displayed on the LCD 308. On the other hand, the image data with high resolution is temporarily stored in the buffer memory 331. The image data read from the buffer memory 331 is inputted to a compression/decompression processing circuit 334 via the data bus 329, and is compressed therein with the compression technology of a JPEG format and the like. The compressed imaged data is stored in the memory card 316 as a recording medium via a media controller 335.

The operating section 310 and the cursor operation button 311 are connected to a CPU 324. When the user operates the operating section 310 and the cursor operation button 311, the CPU 324 obtains a command from the user. In a case where the command is a playback command of the recorded image, the CPU 324 controls a media controller 335 to read the image data from the memory card 316. The CPU 324 controls the compression/decompression processing circuit 334 to decompress the read image data. Then, the CPU 324 controls the LCD driver 332 to display an image on the LCD 308 on the basis of the decompressed image data.

The image signal processing circuit 328 is connected to the CPU 324 via the data bus 329. The CPU 324 controls the image signal processing circuit 328, for the purpose of subjecting the image data with the high resolution stored in the buffer memory 331 to image data processing. The image data processing includes tone conversion, color conversion, hyper-tone processing for compressing the tone of very low frequency luminance component of the image, hyper-sharpness processing for emphasizing the sharpness of the image with curbing granularity, and the like.

The CPU 324 obtains an image record command from the user via the shutter button 306. The CPU 324 operates on the basis of a control program stored on a ROM 336.

In the above digital camera, the imaging device is secured to a flange of a lens barrel holding a taking lens. The imaging device, however, may be secured to a different member from the lens barrel as long as the light receiving surface of the CCD chip is perpendicular to the optical axis of the taking lens. In the above embodiment, the imaging device according to the first embodiment is installed in the digital camera, but the imaging device according to another embodiment may be installed therein.

Figure 23:
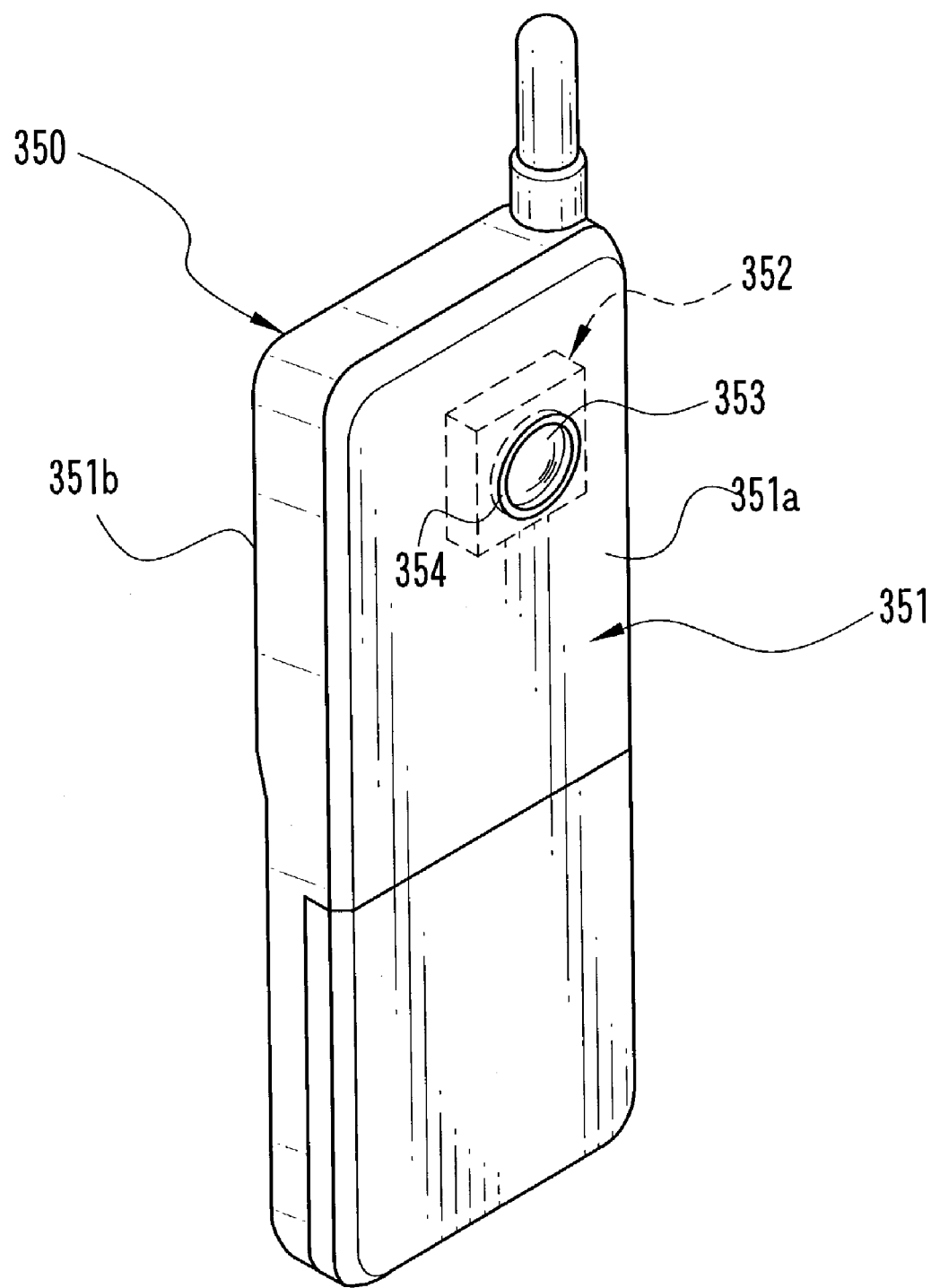
FIG. 23 is a rear perspective view of a camera-equipped mobile phone in which an imaging device according to the present invention is installed.

FIG. 23 shows a camera-equipped mobile phone in which the imaging device according to the present invention is installed. A main body 351 of a mobile phone 350 contains a lens unit 352 which functions as a camera section. The lens unit 352 comprises a taking lens 353 for composing an optical system, a lens barrel 354 for holding the taking lens 353, and the imaging device 10 secured to the flange of a lens barrel 354. The taking lens 353 and the lens barrel 354 are exposed from a rear wall 351a of the main body 351.

The substrate 18 of the imaging device 10 is equipped with an amplifier, and an analog-to-digital converter. When the mobile phone 350 is in a photography mode, the amplifier amplifies analog image pickup signals outputted from the CCD chip 15, and then the analog-to-digital converter converts the amplified signals into digital image data. The image data is stored in a memory contained in the main body 351. An LCD (not illustrated) provided in the front wall of the main body 351 displays a subject image photographed through the taking lens. When the user operates a specific key which functions as a shutter button with seeing the subject image, the image data is recorded on a memory card.

What is claimed is:

1. A method for manufacturing an imaging device by fixing an imaging device chip with a light receiving surface on a substrate, said method comprising the steps of:
    (a) exposing said light receiving surface through an exposure opening formed in said substrate;
    (b) making chip terminals provided on said imaging device chip contact with substrate terminals provided on said substrate;
    (c) aligning said imaging device chip so that said imaging device chip is in parallel to said substrate, while melting said chip terminals and said substrate terminals;
    (d) stopping melting said chip terminals and said substrate terminals, whereby said chip terminals are welded to said substrate terminals;
    (h) attaching a dustproof member around said light receiving surface; and
    (i) elastically deforming said dustproof member when said chip terminals come into contact with said substrate terminals, and said dustproof member filling a gap between said imaging device chip and said substrate.

2. A method recited in claim 1, wherein said imaging device chip is mounted on a holder, and said imaging device chip is aligned by the movement of said holder.

3. A method recited in claim 2, further comprising the step of:
    (e) inserting an ultrasound generator into a slit formed in said holder, to melt said chip terminals and said substrate terminals by driving said ultrasound generator.

4. A method recited in claim 2, further comprising the step of:
- (f) inserting a heater into a slit formed in said holder, to melt said chip terminals and said substrate terminals by driving said heater.

5. A method recited in claim 2, wherein said holder has at least one guide projection for guiding said imaging device chip.

6. A method recited in claim 5, an end of said guide projection being in parallel to said substrate, said method further comprising the step of:
- (g) aligning said imaging device chip by means of pressing said guide projection against said substrate, while said chip terminals and said substrate terminals are melted.

7. A method according to claim 2, wherein said imaging device chip is aligned to be in parallel to the substrate by the movement of the holder.

8. A method according to claim 2, wherein melting of the chip terminals and the substrate terminals is stopped when the imaging device chip is in parallel to the substrate.

9. A method recited in claim 1, wherein said chip terminals include at least one dummy chip terminal, and said substrate terminals include at least one dummy substrate terminal, and said imaging chip is electrically nonconductive to said substrate through said dummy chip terminal and said dummy substrate terminal.

10. A method according to claim 9, wherein said at least one dummy chip terminal and said at least one dummy substrate terminal are disposed at a same corner of the imaging device chip and the substrate.

11. A method according to claim 1 wherein said dustproof member comprises rubber and a frame shape which is attached around the light receiving surface.

12. A method according to claim 1, wherein said substrate terminals comprise plate shaped solder lands.

13. A method according to claim 1, wherein each of a plurality of chip terminals align with each of a respective plurality of substrate terminals.

14. A method according to claim 1, wherein the melting of said chip terminals and said substrate terminals is stopped when said imaging device chip and said substrate are parallel.

15. A method according to claim 1, further comprising the step of:
- (j) securing perpendicularly a lens barrel to said substrate so that said light receiving surface becomes perpendicular to an optical axis of a lens of said lens barrel.

16. An imaging device comprising:
- an imaging device chip having a light receiving surface;
- a substrate electrically connected to said imaging device chip, an exposure opening for exposing said light receiving surface being formed in said substrate;
- chip terminals provided on said imaging device chip;
- substrate terminals provided on said substrate, said chip terminals being welded to said substrate terminals in such a manner that said imaging device chip is in parallel to said substrate; and
- a dustproof member attached around said light receiving surface, wherein said dustproof member is elastically deformed when said chip terminals come into contact with said substrate terminals, and wherein said dustproof member fills a gap between said imaging device chip and said substrate.

17. An imaging device recited in claim 16, wherein said chip terminals are arranged on both sides of said light receiving surface.

18. An imaging device recited in claim 16, wherein said chip terminals are so arranged as to surround said light receiving surface.

19. An imaging device recited in claim 16, wherein said chip terminals are solder in the shape of an approximately sphere, a cube, or a plate.

20. An imaging device recited in claim 16, wherein said substrate terminals are solder in the shape of an approximately sphere, a cube, or a plate.

21. An imaging device recited in claim 16, wherein said light receiving surface is covered with a cover glass.

22. An imaging device recited in claim 16, wherein said dustproof member is disposed on said imaging device chip in such a manner as to surround said light receiving surface, and
wherein said dustproof member is elastically deformed to fill the gap between said imaging device chip and said substrate when said chip terminals are welded to said substrate terminals.

23. An imaging device recited in claim 22, wherein said dustproof member is disposed on the outside of said chip terminals.

24. An imaging device recited in claim 22, wherein said dustproof member is disposed on the inside of said chip terminals.

25. An imaging device recited in claim 16, wherein said chip terminals include at least one dummy chip terminal, said substrate terminals include at least one dummy substrate terminal, said imaging device chip is electrically nonconductive to said substrate through said dummy chip terminal and said dummy substrate terminal.

26. An imaging device according to claim 16, further comprising a lens barrel which is perpendicularly secured to said substrate so that said light receiving surface becomes perpendicular to an optical axis of a lens of said lens barrel.

* * * * *